(12) United States Patent
Konstantatos et al.

(10) Patent No.: US 11,276,792 B2
(45) Date of Patent: Mar. 15, 2022

(54) METHOD FOR OBTAINING AN N-TYPE DOPED METAL CHALCOGENIDE QUANTUM DOT SOLID-STATE FILM, AND AN OPTOELECTRONIC DEVICE COMPRISING THE OBTAINED FILM

(71) Applicants: FUNDACIÓ INSTITUT DE CIÈNCIES FOTÒNIQUES, Castelldefels (ES); INSTITUCIÓ CATALANA DE RECERCA I ESTUDIS AVANÇATS, Barcelona (ES)

(72) Inventors: Gerasimos Konstantatos, Castelldefels (ES); Iñigo Ramiro, Castelldefels (ES); Onur Ozdemir, Castelldefels (ES)

(73) Assignees: FUNDACIÓ INSTITUT DE CIÈNCIES FOTÒNIQUES; INSTITUCIÓ CATALANA DE RECERCA I ESTUDIS AVANÇATS

( * ) Notice: Subject to any disclaimer, the term of this patent is extended or adjusted under 35 U.S.C. 154(b) by 96 days.

(21) Appl. No.: 16/863,681

(22) Filed: Apr. 30, 2020

(65) Prior Publication Data
US 2020/0350446 A1    Nov. 5, 2020

(30) Foreign Application Priority Data
Apr. 30, 2019  (EP) .................................. 19382326

(51) Int. Cl.
*H01L 31/0352*    (2006.01)
*H01L 31/0296*    (2006.01)
(Continued)

(52) U.S. Cl.
CPC .. *H01L 31/035218* (2013.01); *H01L 31/0272* (2013.01); *H01L 31/0296* (2013.01);
(Continued)

(58) Field of Classification Search
CPC ......... H01L 31/035218; H01L 31/0272; H01L 31/0296; H01L 31/035263; H01L 31/09;
(Continued)

(56) References Cited

U.S. PATENT DOCUMENTS 9,099,663 B1    8/2015  Chuang et al.
9,318,628 B2    4/2016  Guyot-Sionnest et al.
(Continued)

OTHER PUBLICATIONS

Beygi et al., "Surface chemistry of as-synthesized and air-oxidized PbS quantum dots", Appl. Surf. Sci. (2018) doi: https://doi.org/.
(Continued)

*Primary Examiner* — David Vu
*Assistant Examiner* — Brandon C Fox
(74) *Attorney, Agent, or Firm* — Jenkins, Wilson, Taylor & Hunt, P.A.

(57) ABSTRACT

Provided are methods for obtaining n-type doped metal chalcogenide quantum dot solid-state films. In some embodiments, the methods include forming an metal chalcogenide quantum dot solid-state film, carrying out a n-doping process on the metal chalcogenide quantum dots of the metal chalcogenide quantum dot solid-state film so that they exhibit intraband absorption, wherein the process includes partially substituting chalcogen atoms by halogen atoms in the metal chalcogenide quantum dots and providing a substance on the plurality of metal chalcogenide quantum dots, to avoid oxygen p-doping of the metal chalcogenide quantum dots. Also provided are optoelectronic devices, which in some embodiments can include an n-type doped metal chalcogenide quantum dot solid-state film (A) obtained by a method as disclosed herein and first (E1) and second (E2) electrodes in physical contact with two respective distanced regions of the film (A).

16 Claims, 26 Drawing Sheets

(51) Int. Cl.
  *H01L 31/0272* (2006.01)
  *H01L 31/09* (2006.01)
  *H01L 31/109* (2006.01)
  *H01L 31/18* (2006.01)
  *H01L 31/032* (2006.01)

(52) U.S. Cl.
  CPC ...... *H01L 31/035263* (2013.01); *H01L 31/09* (2013.01); *H01L 31/109* (2013.01); *H01L 31/1828* (2013.01); *H01L 31/02963* (2013.01); *H01L 31/0325* (2013.01); *H01L 31/18* (2013.01)

(58) Field of Classification Search
  CPC ............... H01L 31/109; H01L 31/1828; H01L 31/0325; H01L 31/02963; H01L 31/18
  USPC ...................................................... 257/12, 43
  See application file for complete search history.

(56) References Cited

U.S. PATENT DOCUMENTS

| | | | |
|---|---|---|---|
| 2010/0038638 A1* | 2/2010 | Tao | C25D 5/50 257/43 |
| 2016/0343891 A1* | 11/2016 | Heo | H01L 29/786 |
| 2017/0018669 A1 | 1/2017 | Williams et al. | |

OTHER PUBLICATIONS

Cao et al., "The role of surface passivation for efficient and photostable PbS quantum dot solar cells", Nature Energy, vol. 1, No. 16035 (2016).
Datta, S., Electronic Transport in Mesoscopic Systems, Cambridge University Press, pp. 1-377 (1997).
Deng et al., "Colloidal Quantum Dots Intraband Photodetectors", ACS Nano, Just Accepted Manuscript, DOI: 10.1021/nn505092a Publication Date Oct. 24, 2014.
Diaconescu et al., "Measurement of Electronic States of PbS Nanocrystal Quantum Dots using Scanning Tunneling Spectroscopy: The Role of Parity Selection Rules in Optical Absorption", Phys. Rev. Lett., vol. 110 (2013) DOI: 10.1103/PhysRevLett.110.127406.
European Search Report corresponding to European application No. EP 19382326 dated Nov. 7, 2019.
Gibbs et al., "Temperature dependent band gap in PbX (X=S,Se,Te)", Applied Physics Letter, vol. 103, 262109 (2013); doi: 10.1063/1.4858195.
Goubet et al., "Wave-Function Engineering in HgSe/HgTe Colloidal Heterostructures to Enhance Mid-infrared Photoconductive Properties", Nano Lett. 18, 4590 (2018).
Ihly et al., "The Photothermal Stability of PbS Quantum Dot Solids", ACS Nano, vol. 5, No. 10 pp. 8175-8186 (2011).
Ip et al., "Hybrid passivated colloidal quantum dot solids", Nature Nanotechnology, vol. 7 pp. 577-582 (2012).
Kang et al., "Electronic structure and optical properties of PbS and PbSe quantum dots", J. Opt. Soc. Am., vol. 14, No. 7 pp. 1632-1646 (1997).
Keuleyan et al., "Mid-infrared HgTe colloidal quantum dot photodetectors", Nature Photonics, vol. 5 pp. 489-493 (2011).
Kim et al., "Self-doped colloidal semiconductor nanocrystals with intraband transitions in steady state", Chem. Commun., vol. 54 pp. 8435-8445 (2018).

Kittel, C., "Introduction to Solid State Physics", Eight Edition, John Wiley & Sons, pp. 1-680 (2005).
Koh et al., "Heavily doped n-type PbSe and PbS nanocrystals using ground-state charge transfer from cobaltocene", Sci. Rep. vol. 3, 2004 (2013).
Konstantatos et al., "Engineering the Temporal Response of Photoconductive Photodetectors via Selective Introduction of Surface Trap States", Nano Lett. vol. 8, No. 5 pp. 1447-1450 (2008).
Kroupa et al., "Synthesis and Spectroscopy of Silver-Doped PbSe Quantum Dots", J. Am. Chem. Soc., vol. 139, pp. 10382-10394 (2017).
Lee et al., "Inorganic UV-Visible-SWIR Broadband Photodetector Based on Monodisperse PbS Nanocrystals", Small, vol. 12, No. 10 pp. 1328-1333 (2016).
Leschkies et al., "Influence of Atmospheric Gases on the Electrical Properties of PbSe Quantum-Dot Films", J. Phys. Chem., vol. 114 pp. 9988-9996 (2010).
Lhuillier et al., "Infrared Photodetection Based on Colloidal Quantum-Dot Films with High Mobility and Optical Absorption up to THz", Nano Lett., vol. 16, pp. 1282-1286 (2016).
Liu et al., "Systematic optimization of quantum junction colloidal quantum dot solar cells", Applied Physics Letters, vol. 101, 151112(2012).
Lu et al., "n-type PbSe Quantum Dots via Post-Synthetic Indium Doping", J. Am. Chem. Soc., vol. 140, 13753 (2018).
Martyniuk et al., "Quantum-dot infrared photodetectors: Status and outlook", Progress in Quantum Electronics, vol. 32 pp. 89-120 (2008).
Miller et al., "Revisiting the Valence and Conduction Band Size Dependence of PbS Quantum Dot Thin Films", ACS Nano, vol. 10, No. 3302 (2016).
Moreels et al., "Size-Dependent Optical Properties of Colloidal PbS Quantum Dots", ACS Nano, vol. 3, No. 10 pp. 3023-3030 (2009).
Ning et al., "Air-stable n-type colloidal quantum dot solids", Nature Materials, vol. 13, 822. (2014).
Nootz et al., "Role of Symmetry Breaking on the Opitcal Transitions in Lead-Salt Quantum Dots", Nano Lett., vol. 10 pp. 3577-3582 (2010).
Rogalski, A., "Infrared detectors: an overview", Infrared Physics & Technology, vol. 43, pp. 187-210 (2002).
Schimpf et al., "Electronic Doping and Red ox-Potential Tuning in Colloidal Semiconductor Nanocrystals", Acc. Chem. Res. Vvol. 48, pp. 1929-1937 (2015).
Shim et al., "n-type colloidal semiconductor nanocrystals", Nature, vol. 407, pp. 981-983 (2000).
Stavrinadis et al., "Heterovalent cation substitutional doping for quantum dot homojunction solar cells", Nature Communications, vol. 4, 13753 (2013).
Stavrinadis et al., "Strategies for the Controlled Electronic Doping of Colloidal Quantum Dot Solids", ChemPhysChem, vol. 17 pp. 632-644 (2016).
Torquato et al., "Dense packings of the Platonic and Archimedean solids", Nature Lett., vol. 460, pp. 876-879 (2009).
Voznyy et al., "A Charge-Orbital Balance Picture of Doping in Colloidal Quantum Dot Solids", ACS Nano, vol. 6, No. 9 pp. 8448-8455 (2012).
Zhang et al., "Diffusion-Controlled Synthesis of PbS and PbSe Quantum Dots with in Situ Halide Passivation for Quantum Dot Solar Cells", ACS Nano, vol. 8, No. 1 pp. 614-622 (2014).
Zhitomirsky et al., "N-type Colloidal-Quantum-Dot Solids for Photovoltaics", Advanced Materials, vol. 24, No. 46(2012).
Zhitomirsky et al., "N-Type Colloidal-Quantum-Dot Solids for Photovoltaics", Adv. Mater, vol. 24, 6181 (2012).

* cited by examiner

Pb-rich (111)

METHOD FOR OBTAINING AN N-TYPE DOPED METAL CHALCOGENIDE QUANTUM DOT SOLID-STATE FILM, AND AN OPTOELECTRONIC DEVICE COMPRISING THE OBTAINED FILM

CROSS-REFERENCE TO RELATED APPLICATIONS

This application is based on and claims the benefit of priority from European Patent Application No. 19382326, filed on Apr. 30, 2019, the contents of which are expressly incorporated by reference herein.

FIELD OF THE INVENTION

The present invention relates, in a first aspect, to a method for obtaining an n-type doped metal chalcogenide quantum dot solid-state film, comprising a robust n-doping process that make the metal chalcogenide quantum dots exhibit intraband absorption.

A second aspect of the present invention relates to product, such as an optoelectronic device, comprising an n-type doped metal chalcogenide quantum dot solid-state film obtained according to the method of the first aspect of the invention.

BACKGROUND OF THE INVENTION

Optical sensing in the mid and long-wave infrared (MWIR, LWIR) is of paramount importance for a large spectrum of applications including environmental monitoring, gas sensing, hazard detection, food and product manufacturing inspection, etc. Yet, such applications to date are served by costly and complex epitaxially grown HgCdTe, quantum-well and quantum-dot infrared photodetectors. The possibility of exploiting low-energy intraband transitions make colloidal quantum dots (CQD) an attractive low-cost alternative to expensive low bandgap materials for infrared applications. Unfortunately, fabrication of quantum dots exhibiting intraband absorption is technologically constrained by the requirement of controlled heavy doping, which has limited, so far, MWIR and LWIR CQD detectors to mercury-based materials.

The possibility of exploiting low-energy intraband transitions makes colloidal quantum dots an attractive low-cost alternative to current expensive low bandgap materials employed for infrared applications [1-3]. Stable high doping of CQDs is required in order to achieve steady-state intraband absorption [4]. However, precise control of doping is an ongoing challenge in CQD technology [5], even more so if long-term stability under air is needed. For this reason, although steady-state intraband absorption has been demonstrated in different materials (see [4] for a review), the first devices exploiting intraband transitions (MWIR photodetectors) have only recently been demonstrated using mercury chalcogenide nanocrystals [6-8].

Prior reports of doping PbS quantum dots (QDs) have relied on aliovalent cation or anion: $Ag^+$ substitution of $Pb^{2+}$ induces p-type character in PbS [9] and PbSe [10], while the substitution of $Pb^{2+}$ by $Bi^{3+}$ or $In^{3+}$ makes PbS [11] and PbSe [12] more n-type. There is also evidence of n-type doping of PbS after ligand exchange with halides [13]. In particular, it has been proposed that partial substitution of $S^{-2}$ by $I^-$ could contribute to rendering PbS n-type [14,15]. Unfortunately, oxygen is an effective p-type dopant in lead chalcogenides and reduces the effectiveness of halide doping in air such that n-type doping in PbS QD solids has been demonstrated only in the low doping regime [13,15]. Remote transfer of electrons from cobaltocene molecules is another reported mechanism of doping n-type PbS and PbSe QDs [16], leading to intraband absorption. However, none of the above approaches have led to robust permanent doping [10,12,16], preventing, thus, their use in devices.

U.S. Pat. No. 9,318,628B2 discloses infrared photodetectors in mid and long wave infrared based on Hg-chalcogenide QDs. However in this patent only interband excitations (i.e. above bandgap) are considered.

It is, therefore, necessary to provide an alternative to the state of the art which covers the gaps found therein, by providing a method for obtaining an n-type doped metal chalcogenide quantum dot solid-state film, and an optoelectronic device including the same, where the film is heavily n-doped.

SUMMARY OF THE INVENTION

To that end, the present invention relates, in a first aspect, to a method for obtaining an n-type doped metal chalcogenide quantum dot solid-state film, comprising:
  forming a metal chalcogenide quantum dot solid-state film, and
  carrying out an n-doping process on at least a plurality of the metal chalcogenide quantum dots of said metal chalcogenide quantum dot solid-state film so that they exhibit intraband absorption, wherein said n-doping process comprises:
    partially substituting chalcogen atoms by halogen atoms in at least said plurality of metal chalcogenide quantum dots; and
    providing a substance on at least said plurality of metal chalcogenide quantum dots, wherein said substance is made and arranged to avoid oxygen p-doping of the plurality of metal chalcogenide quantum dots.

For an embodiment, the metal chalcogenide is at least one of Pb-, Cd-, and Hg-chalcogenide, the chalcogen atoms are at least one of sulphur, selenium, and tellurium atoms, and the halogen atoms are at least one of iodine, bromine, and chlorine atoms.

In other words, the metal chalcogenide is represented by MX in which M can be Pb, Cd, Hg and X can be S, Se, Te, or combinations thereof.

Preferably the crystal structure of the metal chalcogenide quantum dots is of zinc blende or rock salt structure.

Also preferably, in the metal chalcogenide, the metal has a +2 oxidation state and the chalcogen has a −2 oxidation state.

According to an embodiment, the method of the first aspect of the present invention comprises providing the above mentioned substance to coat the metal chalcogenide quantum dot solid-state film to isolate the same from ambient oxygen.

For a complementary or alternative embodiment, the method of the first aspect of the present invention comprises providing the above mentioned substance to infiltrate within the metal chalcogenide quantum dot solid-state film to react with oxygen present therein for suppressing their p-doping effect.

For a preferred embodiment, the method of the first aspect of the present invention comprises providing the above mentioned substance by atomic layer deposition (ALD), although other less preferred deposition techniques are also embraced by the method of the present invention for providing that substance, such as chemical bath deposition or chemical layer deposition.

According to some embodiments, the above mentioned substance is an oxide-type substance.

For some implementations of said embodiments, the above mentioned substance is at least one of alumina, titania, ZnO, and hafnia.

For an embodiment of the method of the first aspect of the present invention, the step of forming the metal chalcogenide quantum dot film comprises forming a solid state film with only one type of quantum dots, having exposed chalcogen facets to allow halide doping and therefore allow n-type doping. In the case of PbS this happens typically for quantum dots with a bandgap of around 1200 nm corresponding to diameter of approximately 4 nm. For this embodiment, the method comprises applying the above mentioned n-doping process on the whole formed solid state film such that all the metal chalcogenide quantum dots are heavily n-doped.

According to an embodiment of the method of the first aspect of the present invention, the step of forming the metal chalcogenide quantum dot film comprises forming a blend with a host matrix of first metal chalcogenide quantum dots and, embedded therein, second metal chalcogenide quantum dots having a smaller bandgap, wherein said second metal chalcogenide quantum dots are larger and have a different morphology than said first metal chalcogenide quantum dots so that the second metal chalcogenide quantum dots possess more exposed facets containing chalcogen atoms which allows efficient electronic doping by halide substitution, and wherein the method comprises applying the above mentioned n-doping process on the whole formed metal chalcogenide quantum dot film such that the second metal chalcogenide quantum dots are heavily n-doped (because they possess the appropriate planes to allow doping) while the first metal chalcogenide quantum dots are not n-doped or only slightly n-doped. In this way, the dark conductivity of a photodetector including the so obtained film is suppressed, which may lead to enhanced SNR compared to devices based on a single QD size that are all doped.

For an implementation of said embodiment, the method of the first aspect of the present invention comprises selecting the bandgaps and band alignment of the first and second metal chalcogenide quantum dots such that they form a type-I heterojunction and a band offset which makes that the energy difference in the conduction or in the valence bands is equal or smaller than the intraband energy of the second metal chalcogenide quantum dots.

The method of the first aspect of the present invention comprises forming said blend with a concentration of second metal chalcogenide quantum dots preferably ranging from 1% up to 50% by volume, and even more preferably between 5% and 25% by volume.

For an alternative embodiment, the step of forming the metal chalcogenide quantum dot film comprises forming a layered structure alternating layers of first and second metal chalcogenide quantum dots, such as forming a type of superlattice structure, wherein said second metal chalcogenide quantum dots have a smaller bandgap, and are larger and have a different morphology than said first metal chalcogenide quantum dots so that the second metal chalcogenide quantum dots possess more exposed facets containing chalcogen atoms, and wherein the method comprises applying the above mentioned n-doping process:

on the whole formed metal chalcogenide quantum dot film such that the second metal chalcogenide quantum dots are heavily n-doped while the first metal chalcogenide quantum dots are not n-doped or only slightly n-doped; or only on the layer or layers of second metal chalcogenide quantum dots.

According to an implementation of any of the above two described alternative embodiments, the method of the first aspect of the present invention comprises selecting the size and morphology of the first metal chalcogenide quantum dots such that they do not possess any chalcogen-rich exposed facet, and selecting the size and morphology of the second metal chalcogenide quantum dots such that they do possess from one to six chalcogen-rich exposed facets.

For some embodiments, regarding the metal chalcogenide quantum dots which are or are to be heavily n-doped, their size ranges from 2 nm to 30 nm in diameter, their bandgaps ranges from 2.5 eV down to 0.2 eV, and their thickness ranges from 20 nm to 10 μm, preferably between 100 nm and 1 μm.

A second aspect of the present invention relates to a product comprising at least one n-type doped metal chalcogenide quantum dot solid-state film obtained according to the method of the first aspect for any embodiment.

For a preferred embodiment, the product of the second aspect of the present invention constitutes an optoelectronic device, which further comprises first and second electrically conductive electrodes in physical contact with two respective distanced regions of the at least one n-type doped metal chalcogenide quantum dot solid-state film.

For an embodiment, the at least one n-type doped metal chalcogenide quantum dot solid-state film is a light absorption film made to exhibit intraband absorption to light having a wavelength included in a predetermined wavelength range that extends beyond the absorption range of the bandgap of the metal chalcogenide quantum dots when not n-doped.

According to an implementation of said embodiment, said predetermined wavelength range includes mid- and long-wave infrared radiation, and preferably goes at least from 5 μm up to 12 μm wavelength.

For a preferred embodiment, the optoelectronic device implements a photodetector made to detect light with any wavelength included in the above mentioned predetermined wavelength range, as well as within the wavelength range of interband absorption of the metal chalcogenide quantum dots of the n-type doped metal chalcogenide quantum dot solid-state film.

According to a first implementation of said preferred embodiment, the photodetector is a planar photodetector, comprising a substrate on top of which the at least one n-type doped metal chalcogenide quantum dot solid-state film and the first and second electrically conductive electrodes are deposited.

For a first variant of said first implementation, the substrate is not transparent to light having a wavelength included in the predetermined wavelength range, so that the photodetector detects light coming from top directly incident on the at least one n-type doped metal chalcogenide quantum dot solid-state film.

For a second variant of said first implementation, the substrate is transparent to light of any wavelength included in the predetermined wavelength range, so that the photodetector detects light coming from bottom passing through the substrate before impinging on the at least one n-type doped metal chalcogenide quantum dot solid-state film.

According to a second implementation of the above mentioned preferred embodiment, the photodetector is a vertical photodetector, comprising a substrate on top of which the first electrically conductive electrode is deposited, wherein the at least one n-type doped metal chalcogenide quantum dot solid-state film is deposited on top of the first electrically conductive electrode, and the second electrically conductive electrode is deposited on top of the at least one n-type doped metal chalcogenide quantum dot solid-state film.

For a first variant of said second implementation, the substrate and the second electrically conductive electrode are, respectively, non-transparent and transparent to light having a wavelength included in said predetermined wavelength range, and the first electrically conductive electrode is reflective to light having a wavelength included in the predetermined wavelength range, so that the photodetector detects light coming from top passing through the second electrically conductive electrode, impinging on the at least one n-type doped metal chalcogenide quantum dot solid-state film, and being reflected by the first electrically conductive electrode.

For a second variant of said second implementation, the substrate and the first electrically conductive electrode are both transparent to light having a wavelength included in said predetermined wavelength range, and the second electrically conductive electrode is reflective to light having a wavelength included in the predetermined wavelength range, so that the photodetector detects light coming from bottom passing through the substrate, through the first electrically conductive electrode, impinging on the at least one n-type doped metal chalcogenide quantum dot solid-state film, and being reflected by the second electrically conductive electrode.

The following are examples of possible materials from which the above mentioned first and/or second electrically conductive electrodes are made when being transparent or semi-transparent to light having a wavelength included in the predetermined wavelength range: Graphene, thin metal films or metal oxide TCOS (Transparent conductive oxides), such as ITO (Indium Tin Oxide), AZO (Aluminum-doped Zinc Oxide), IGZO (Indium Gallium Zinc Oxide) or FTO (Fluorine Doped Tin Oxide), that are sufficiently thin to allow for at least 10% transmission in said wavelength, preferably in the infrared wavelengths.

For another embodiment of the optoelectronic device of the second aspect of the present invention, the device comprises the above mentioned solid state film including only heavily n-doped quantum dots, sandwiched between first and second electrically conductive electrodes.

Generally, the photodetector also comprises bias means to apply a bias voltage to one of the above mentioned first and second electrically conductive electrodes, and a read-out unit to read the electric current circulating through the n-type doped metal chalcogenide quantum dot solid-state film.

For an embodiment, the product of the second aspect of the present invention constitutes a non-optoelectronic device.

Further applications of the film obtained according to the method of the first aspect of the invention (whether by implementing optoelectronic devices or non-optoelectronic devices) are, for example: remote sensing, surveillance, thermal imaging, optical spectroscopy, chemical sensing, automotive vision, process inspection, etc.

BRIEF DESCRIPTION OF THE FIGURES

In the following some preferred embodiments of the invention will be described with reference to the enclosed figures. They are provided only for illustration purposes without however limiting the scope of the invention.

FIG. 1A Energy level schematics of solid-state PbS QDs with iodide ligand. $1S_h$ and the Fermi level ($E_F$) are obtained by the measured UPS data. $1S_e$ is obtained by adding the measured optical bandgap to $1S_h$. $1P_e$ is obtained by adding the intraband energy (obtained from the fittings in FIG. 2C) to $1S_e$. All samples were fabricated under air atmosphere. FIG. 1B Quantum-dot doping density, $n_{QD}$, expressed in e$^-$/dot as a function of exciton wavelength. The dashed line is a guide to the eye. Data is obtained through FET and absorption (optical) measurements. Error bars account for the incertitude in the packing density of the CQDs (see Experimental Section). Three approximate wavelength regions are identified: up to 1300 nm: unpopulated $1S_e$; 1300-1800 nm: partially populated $1S_e$; beyond 1800 nm: highly populated $1S_e$. FIG. 1C Absorption measurements of various PbS CQD films—four different sizes—before (dashed lines) and after (solid lines) alumina deposition. Excitonic absorption bleaching is observed upon filling of the $1S_e$ state. Dashed lines have been normalized among them, but each dashed/solid pair of lines keep the proportion of the original data.

FIG. 2A Transmission measurements of iodide-exchanged PbS CQD films before (upper line) and after (lower line) infilling and capping with alumina. The insets illustrate the possibility of intraband absorption and bleach of excitonic absorption as a consequence of filling $1S_e$ state. FIG. 2B Interband and intraband absorption for different sizes of dots. The dotted lines are Gaussian fittings to the intraband absorption peak. FIG. 2C Intraband transition energy as a function of the PbS exciton energy, as obtained from fittings of absorption measurements similar to those in a and b. White dots represent direct measurements of the $1S_e \rightarrow 1P_e$ transition, while black dots are obtained by subtracting the energies of the $1S_h \rightarrow 1P_e$ and the $1S_h \rightarrow 1 S_e$ transitions. Respective displayed lines are linear fittings to the data. (d) The values of the $1S_e$ and $1P_e$ state (referred to the $1S_h$ state) as a function of QD diameter. The inset plots the intrabad energy as a function of the dot diameter. Black lines are exponential fits to the data.

FIG. 3A Absorption spectra, measured at 80K, of three samples with room-temperature exciton wavelengths 1630 nm, 1790 nm and 2000 nm, from top to bottom. FIG. 3B Photodetection quantum efficiency of devices (i), (ii), and (iii), using the same dots as in a. The applied drain-source voltage, $V_{DS}$, and the chopping frequency, f, of the excitation light are indicated. Gaussian fittings (dashed) are superimposed to the measured data. The vertical dashed line indicates the bandgap of bulk PbS at 80K. FIG. 3C Modelled normalised steady-state conductance, $G_0$, of a PbS QDs as a function of the doping level, $n_{QD}$. FIG. 3D Left axes, broken line: modelled increase in conductance, $\Delta G$, due to intraband light absorption; right axes, solid line: modelled photodetection performance, expressed as $\Delta G/G_0$, as a function of $n_{QD}$. Squares (i), (ii), and (iii) indicate the case of the three devices (i), (ii), and (iii), studied in FIG. 3B.

The insets illustrate the impact of the doping in the population of the $1S_e$ states and, therefore, in the value of $G_0$ and $\Delta G$.

FIGS. 4A, 4B, 4C, 4D. UPS data of a secondary electron cut-off and valence band for PbS CQD films of different sizes. For each case, the exciton wavelength is indicated.

Figure 5:
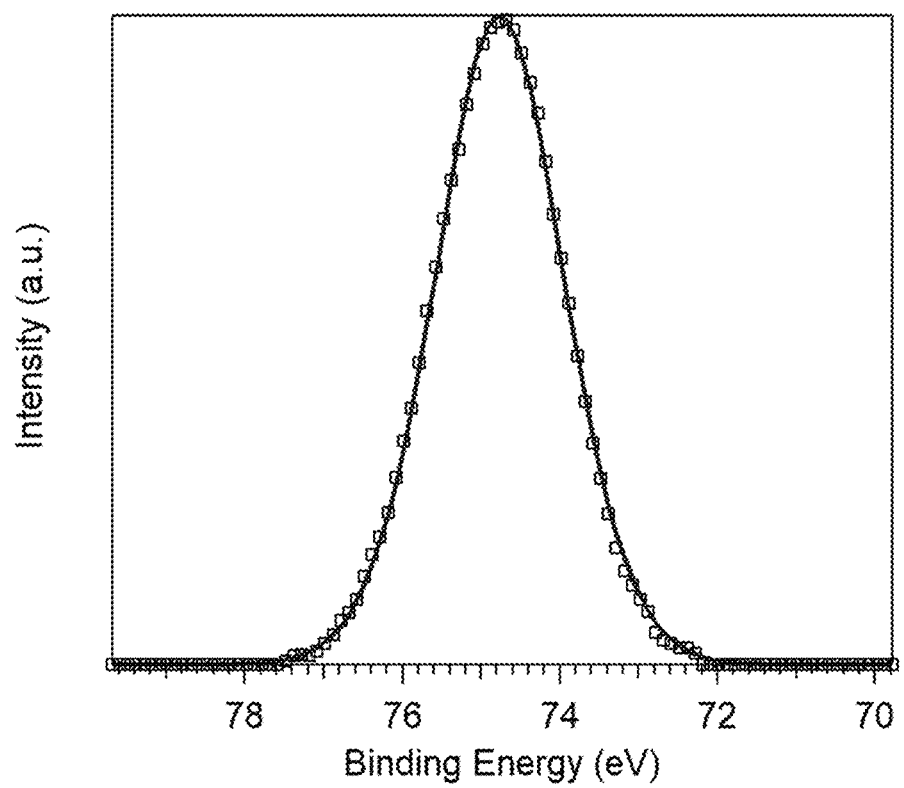
Figure 6A:
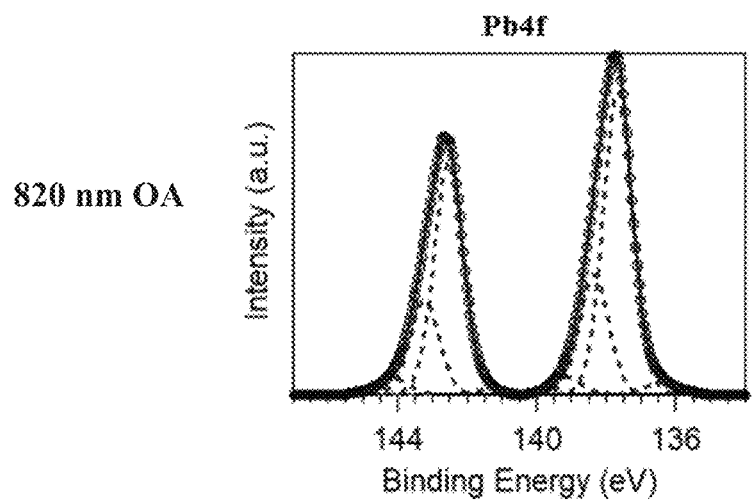
Figure 6B:
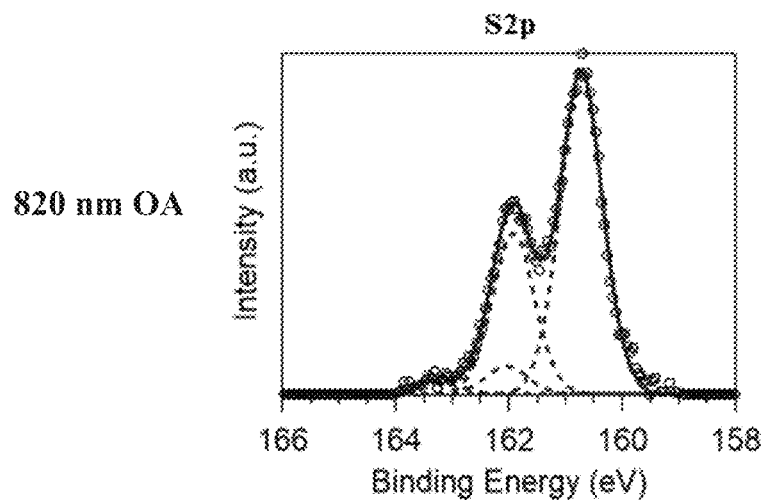
Figure 6C:
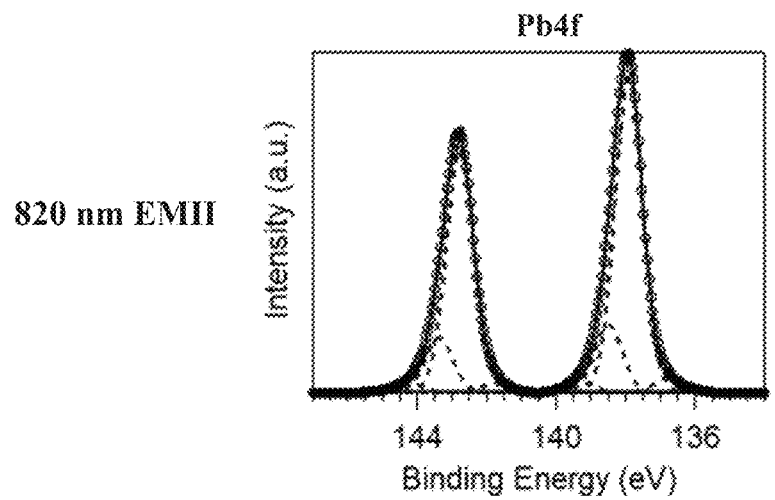
Figure 6D:
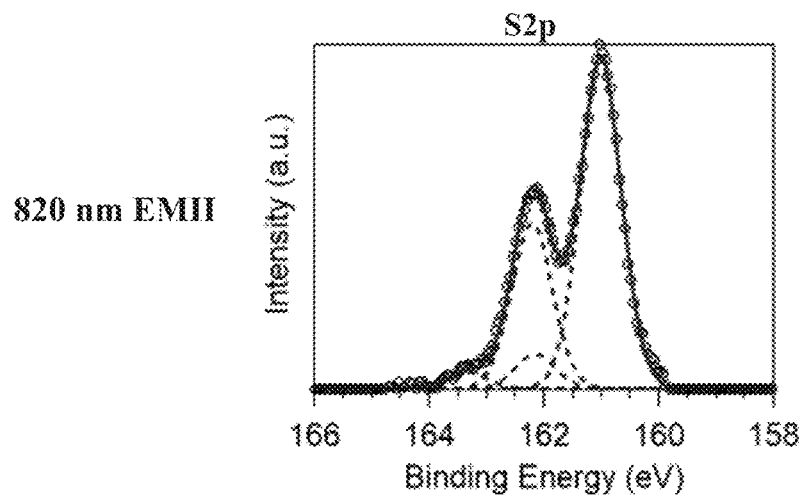
Figure 6E:
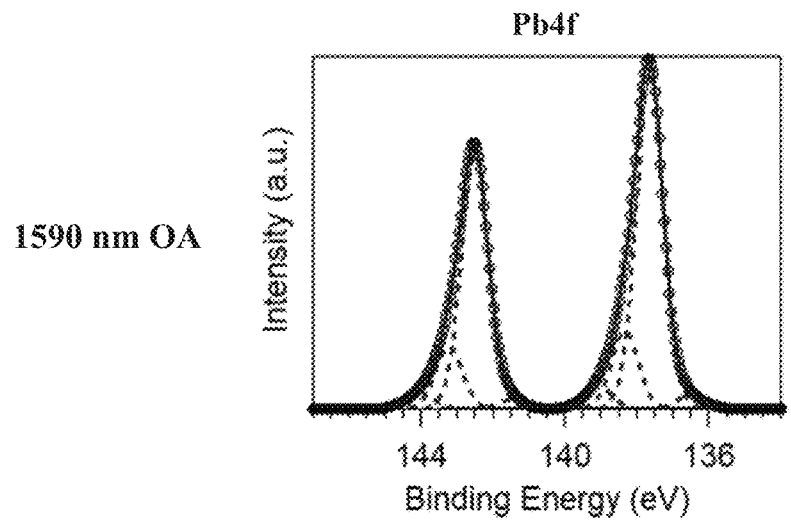
Figure 6F:
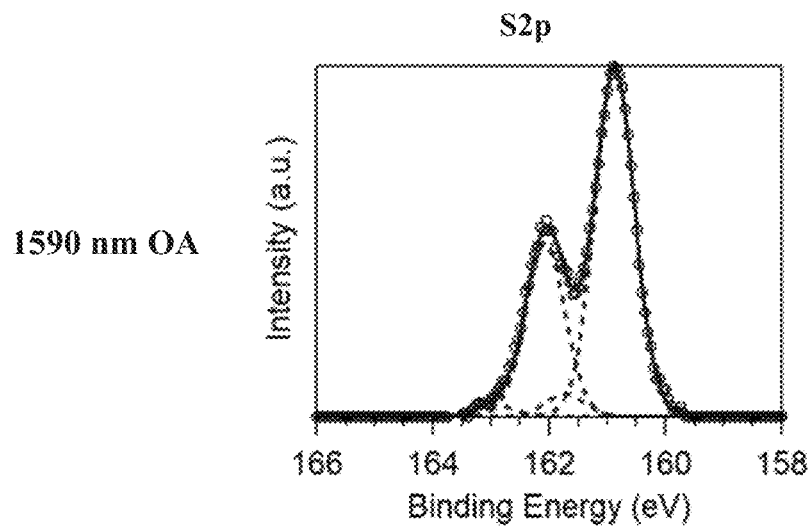
Figure 6G:
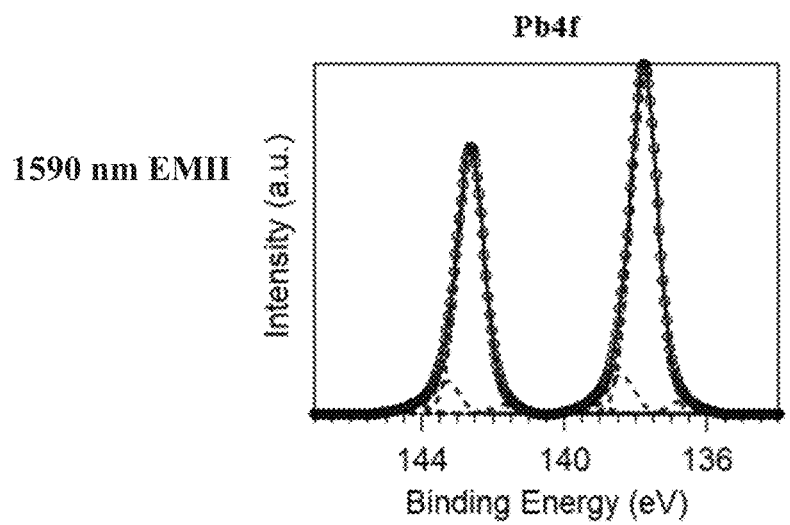
Figure 6H:
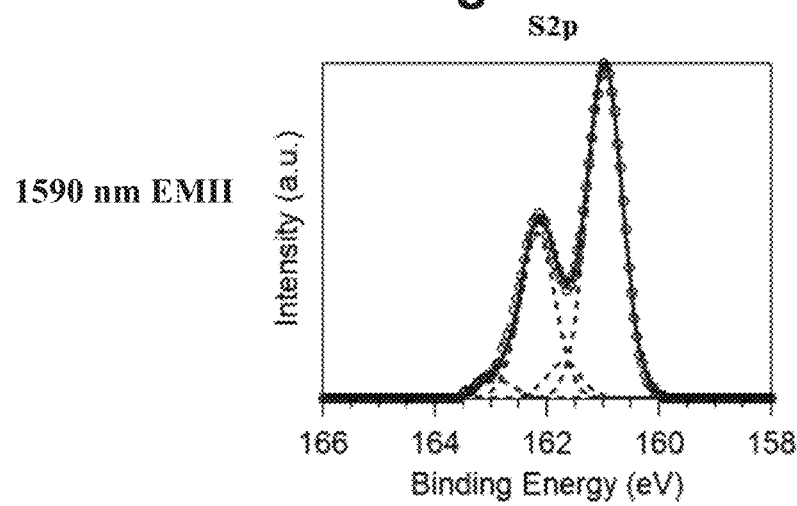
Figure 6I:
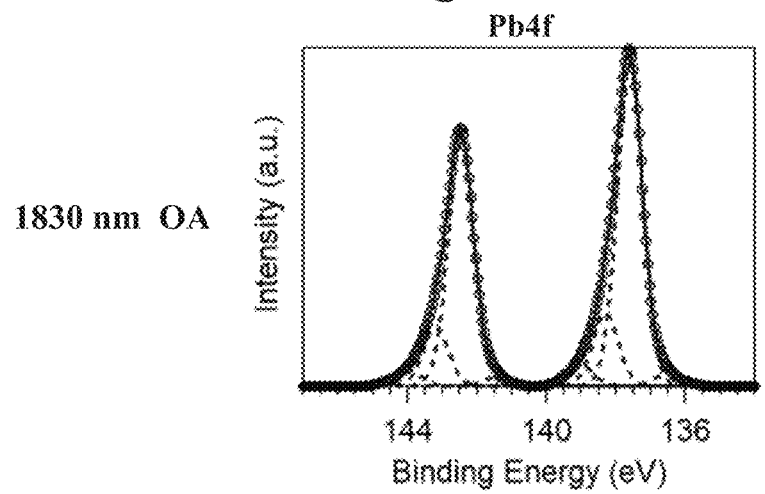
Figure 6J:
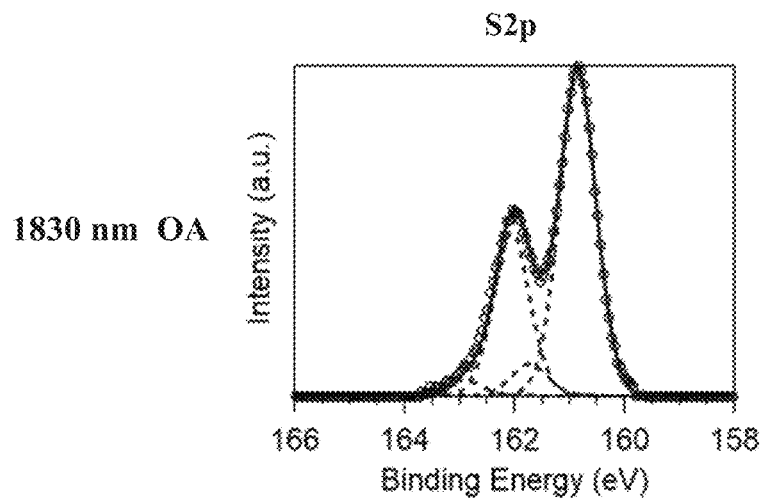
Figure 6K:
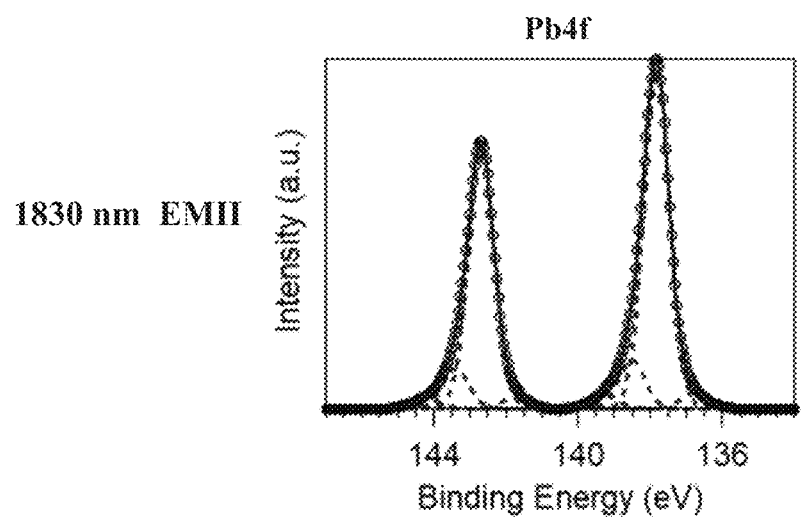
Figure 6L:
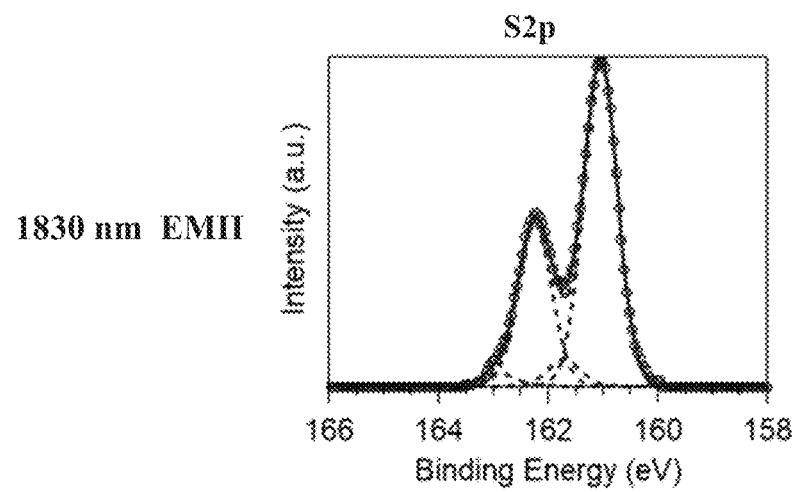
Figure 7A:
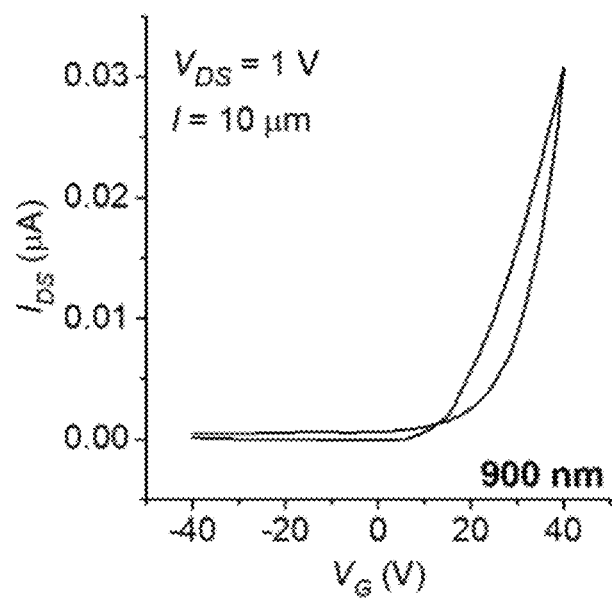
Figure 7B:
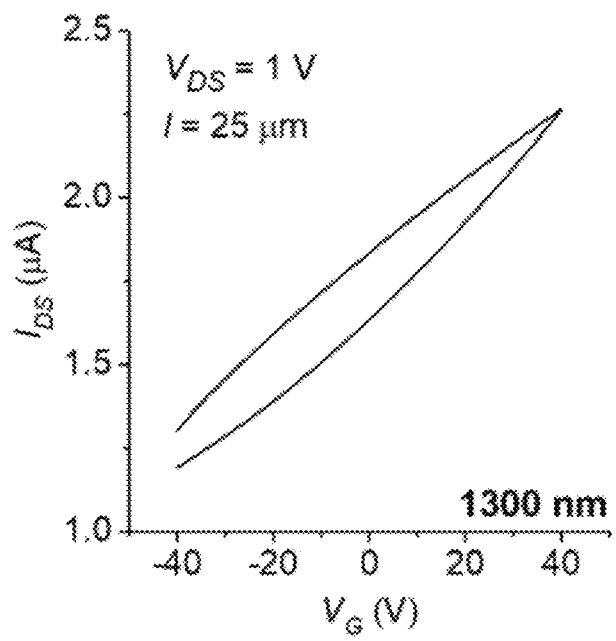
Figure 7C:
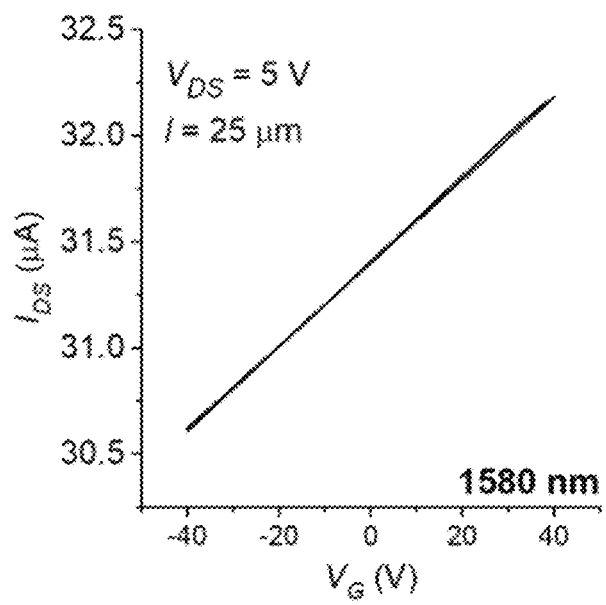
Figure 7D:
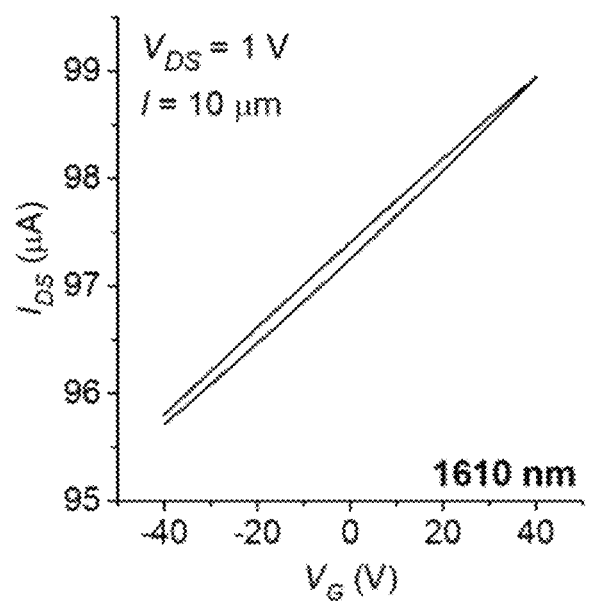
Figure 7E:
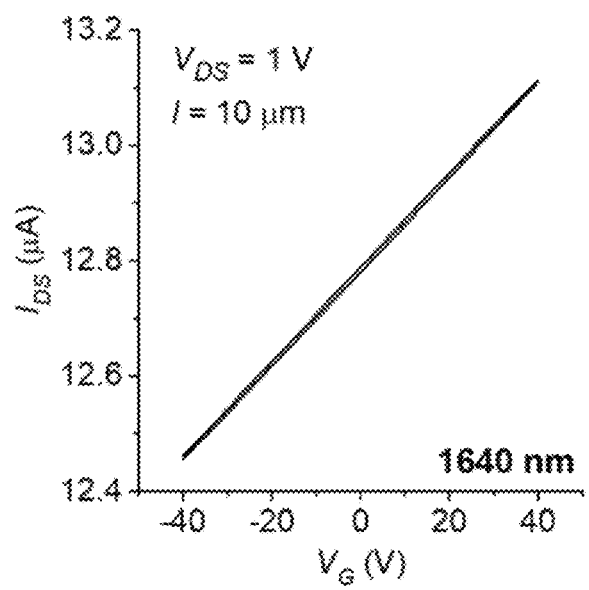
Figure 7F:
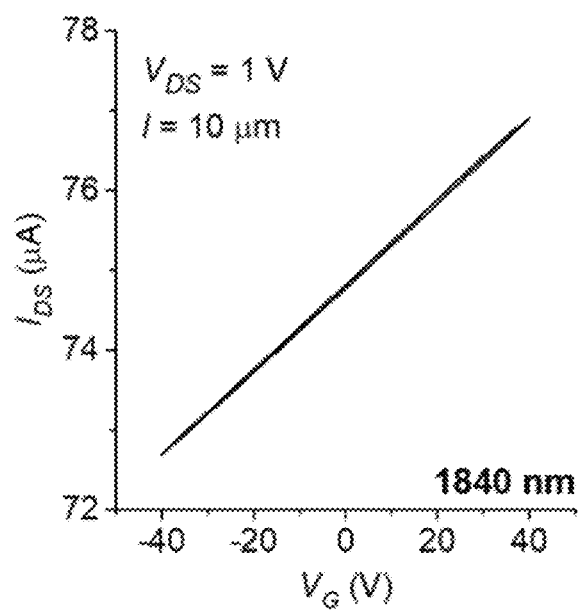
Figure 7G:
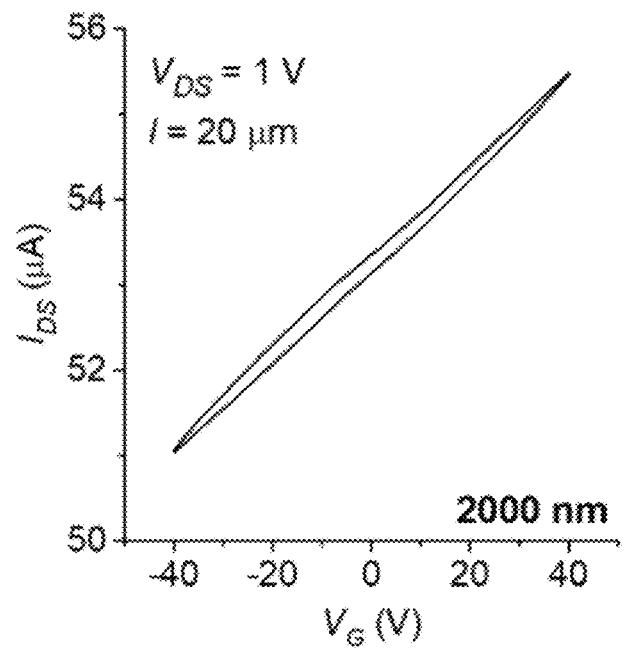
Figure 7H:
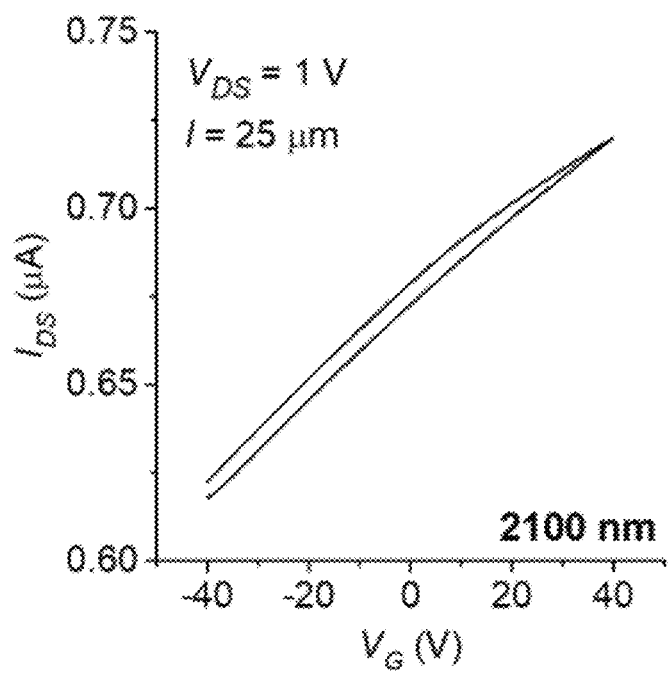

FIG. 5. XPS signal at the Al2p peak of a doped PbS film capped with 5 nm of alumina deposited by ALD according to an embodiment of the method of the first aspect of the present invention. Measured data is plotted with open squares. The solid line is a Gaussian fitting. Sample was submitted to an in situ etching process that removed approximately 20-40 nm of material prior to surface analysis. This result proves that alumina infills the film during the ALD process.

FIGS. 6A to 6L. XPS measurements (open circles), and individual (dashed lines) and total (solid lines) fittings, for Pb and S, in PbS CQDs of different sizes (exciton wavelengths), as synthesized (oleate ligands, OA) and after ligand exchange (iodide ligand, EMII) according to embodiments of the method of the first aspect of the present invention. The measured Pb/S ratios support partial iodide substitution of sulphur atoms during the ligand exchange process.

FIGS. 7A to 7H. FET transfer characteristic ($I_{DS}$–$V_G$) of doped PbS dots with different exciton wavelengths according to embodiments of the method of the first aspect of the present invention. The length of the channel, L, and the value of $V_{DS}$ for each measurement are indicated. All devices exhibit n-type character.

Figure 8:
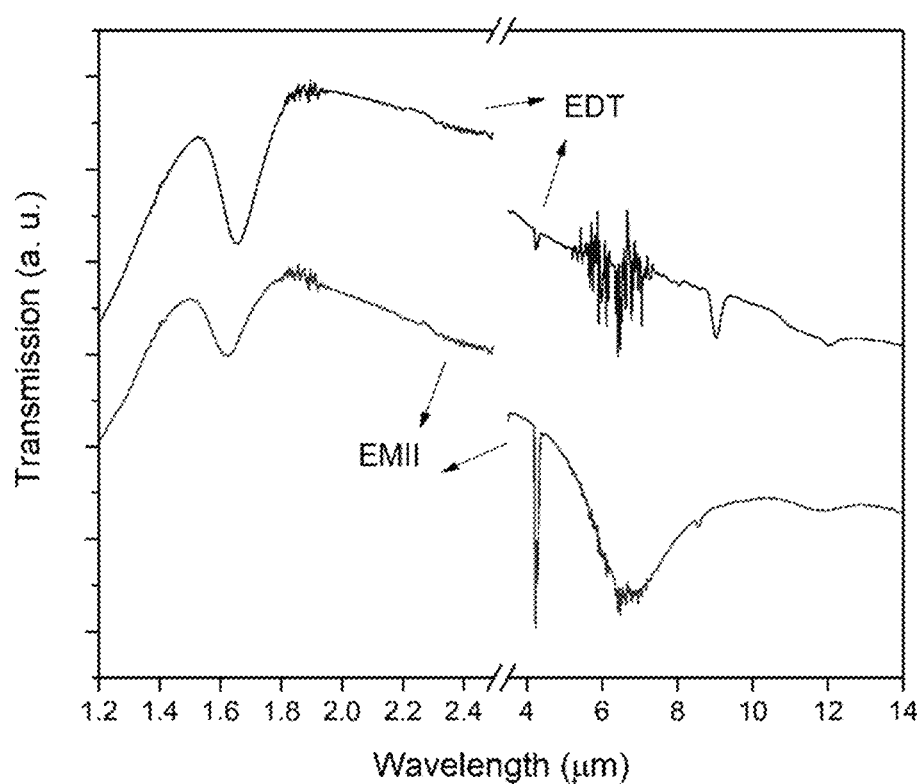

FIG. 8. FTIR transmission spectra of two CQD films spin-coated with the same PbS dots according to embodiments of the method of the first aspect of the present invention. In one of the films, the original oleate ligands were exchanged by iodides (using EMII) and, in the other film, they were exchange by thiols (using EDT). Both films were encapsulated with alumina. The film with iodide ligands shows interband bleach and intraband absorption.

Figure 9:
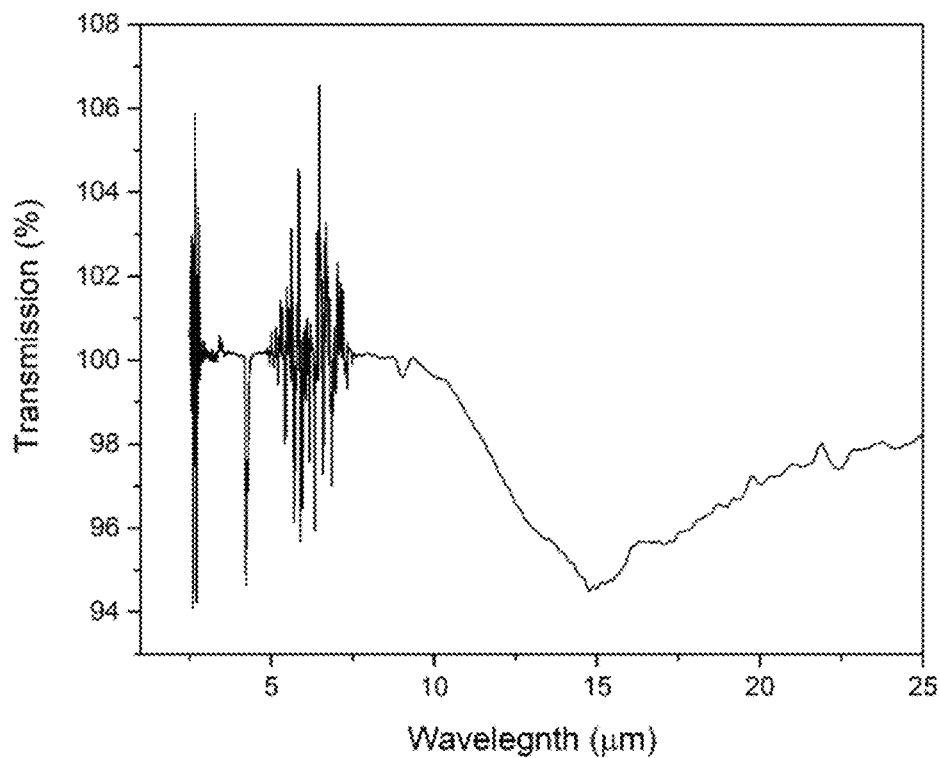

FIG. 9. FTIR transmission measurement of a 20-nm $Al_2O_3$ layer deposited by ALD on a lowly doped (1-10 ohm·cm) silicon substrate. The $Al_2O_3$ transmission spectrum is obtained using a pristine silicon substrate as background sample. $Al_2O_3$ exhibit light absorption in the 10-25 μm range.

Figure 10:
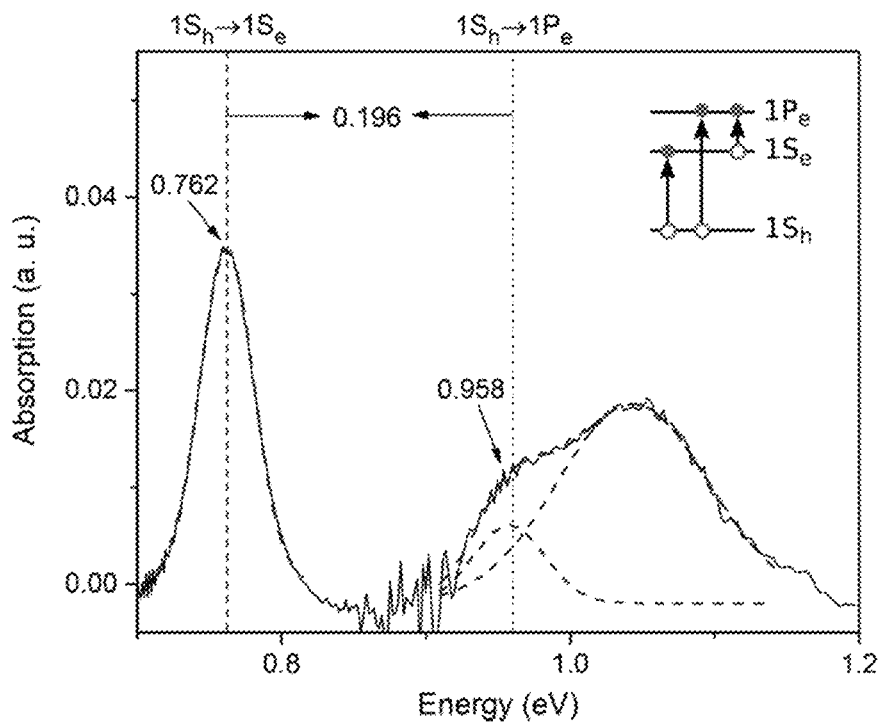

FIG. 10. Absorption spectra of a doped PbS CQD film according to an embodiment of the method of the first aspect of the present invention. Three different transitions are identified through Gaussian fitting (dashed lines). The energy of transitions $1S_h \rightarrow 1S_e$ (first exciton) and $1S_h \rightarrow P_e$ is indicated. The energy difference between those two transitions equals the energy of the intraband transitions $1S_e \rightarrow 1P_e$, as sketched in the inset.

Figure 11:
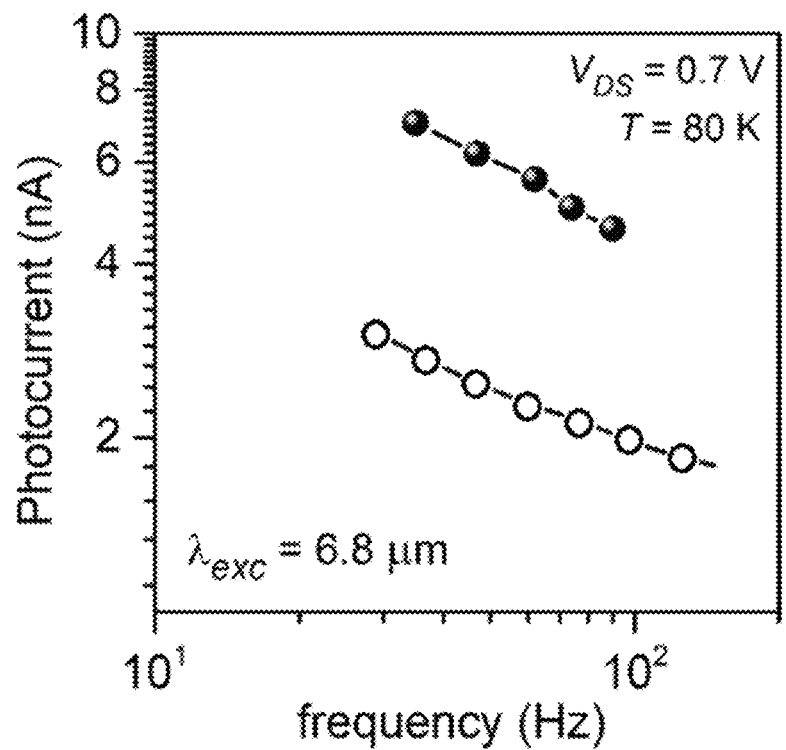

FIG. 11. Frequency dependent intraband photocurrent, under monochromatic 6.8 μm excitation, of PbS CQDs n-doped according to an embodiment of the method of the first aspect of the present invention, with exciton wavelengths at 1630 nm (black dots) and 2000 nm (white dots). The applied $V_{DS}$ was 0.7 V. The inverse relationship of the photocurrent with frequency, down to 30 Hz, indicates that the response time is >30 ms.

Figure 12:
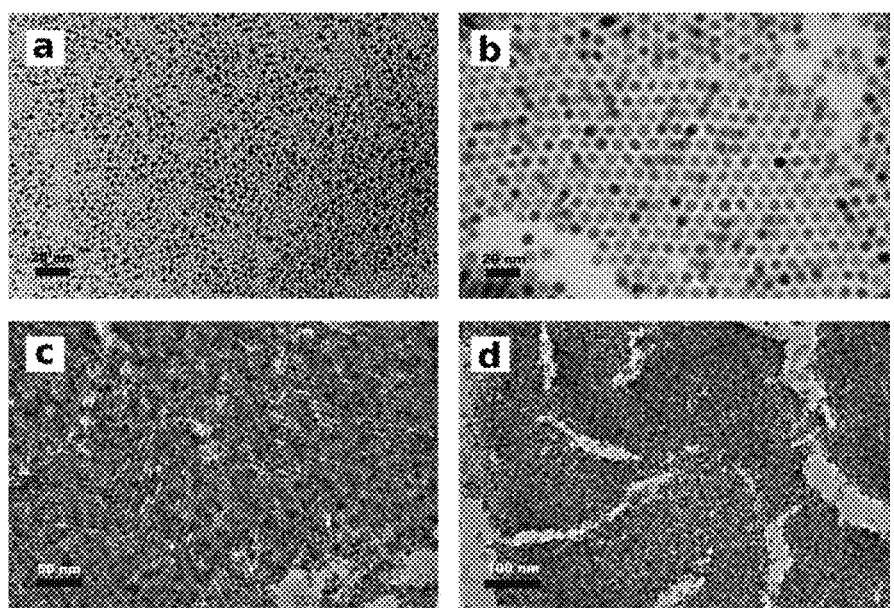

FIG. 12. TEM images of self-assembled PbS CQDs, with oleate ligands and exciton wavelength (a) 820 nm and (b) 1830 nm. (c), (d) TEM images of iodide-exchanged PbS CQD films prepared according to an embodiment of the method of the first aspect of the present invention following the exact same procedure as for the FET and photodetector devices of the present invention. The dots used for fabricating these films are the same as those shown in b.

Figure 13:
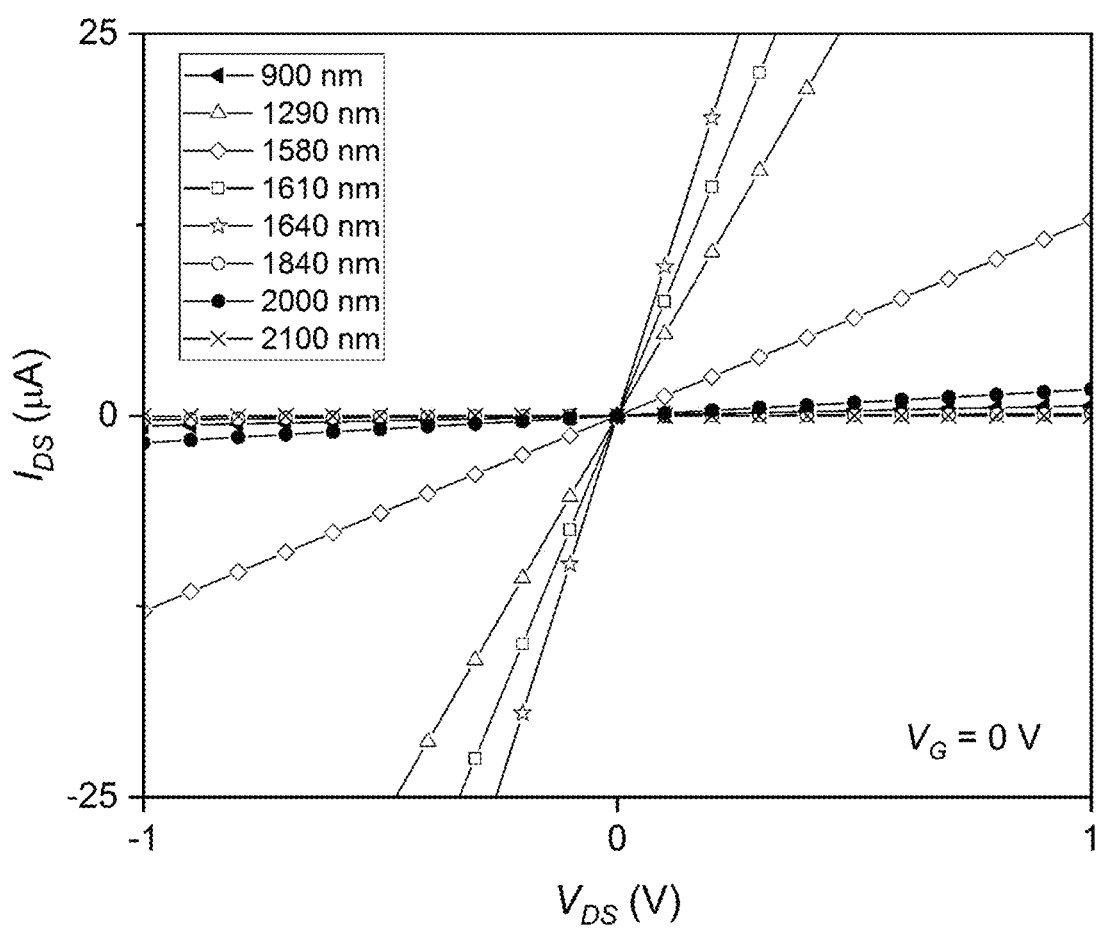

FIG. 13. FET output characteristic ($I_{DS}$ vs $V_{DS}$) of doped PbS dots with different exciton wavelengths, according to embodiments of the method of the first aspect of the present invention. All devices exhibit Ohmic behaviour. Gate voltage, $V_G$, is 0 V for all measurements.

Figure 14:
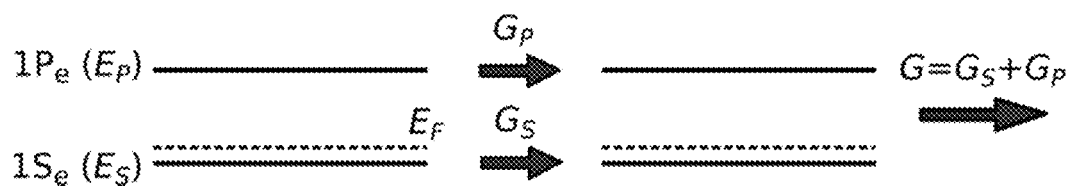

FIG. 14. Scheme of the QD transport model. Transport between dots can occur through $1S_e$ channels ($G_S$) and through $1P_e$ channels ($G_P$). The total conductance is $G=G_S+G_P$. The chosen position of the fermi level, $E_F$, indicates filled $1S_e$ and empty $1P_e$.

Figure 15:
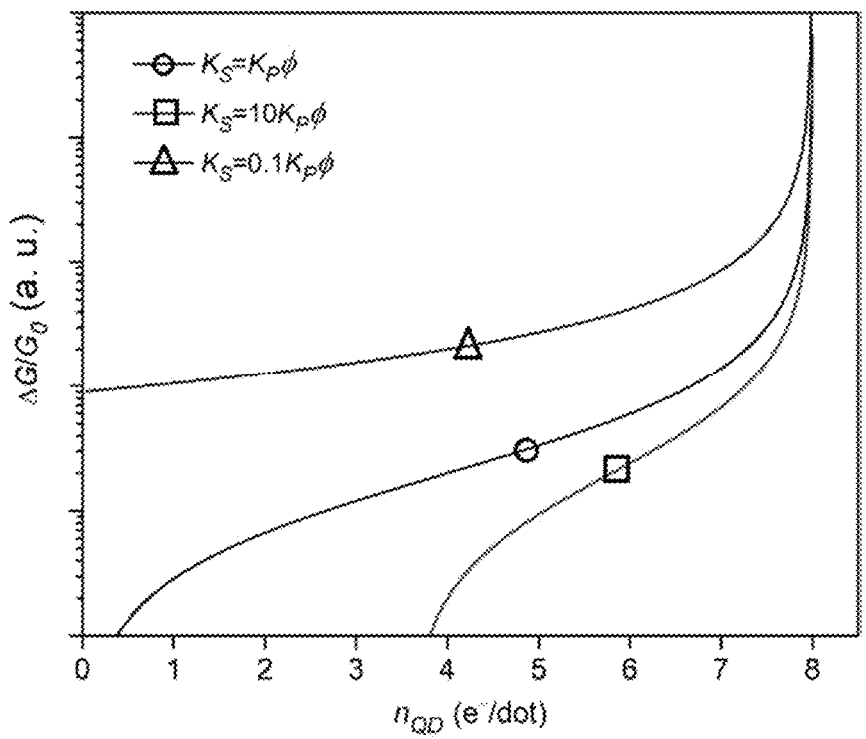

FIG. 15. Impact of the ratio $m=K_S/K_P\Phi$ in the modelled $\Delta G/G_0$. m=1, m=10 and m=0.1 are evaluated.

Figure 16:
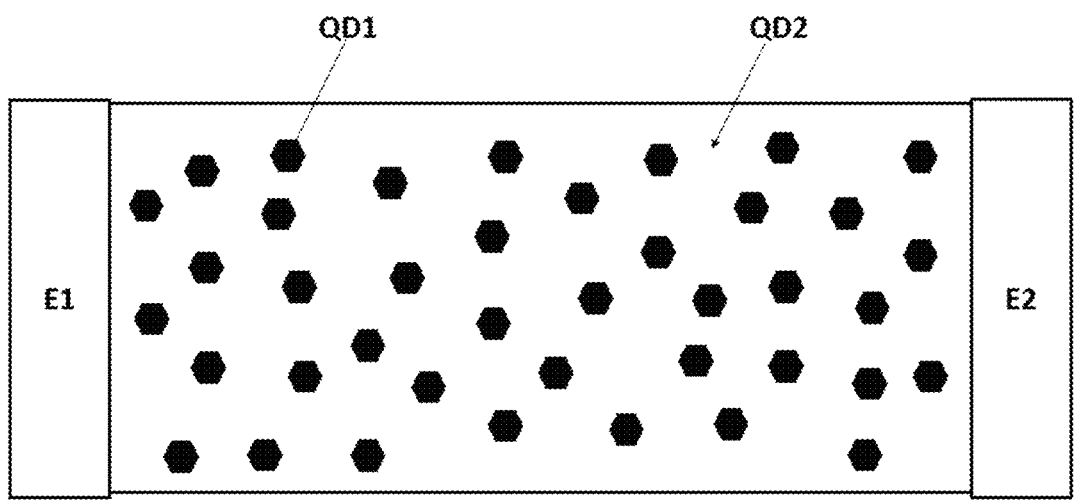

FIG. 16 schematically shows the optoelectronic device of the second aspect of the present invention, for an embodiment in which the optoelectronic device comprises, sandwiched between first and second electrodes, the n-type doped metal chalcogenide quantum dot solid-state film obtained according to the method of the first aspect for an embodiment for which the film is a blend of heavily n-doped metal chalcogenide low bandgap quantum dots embedded within a host matrix of not n-doped (or slightly n-doped) metal chalcogenide high bandgap quantum dots.

Figure 17:
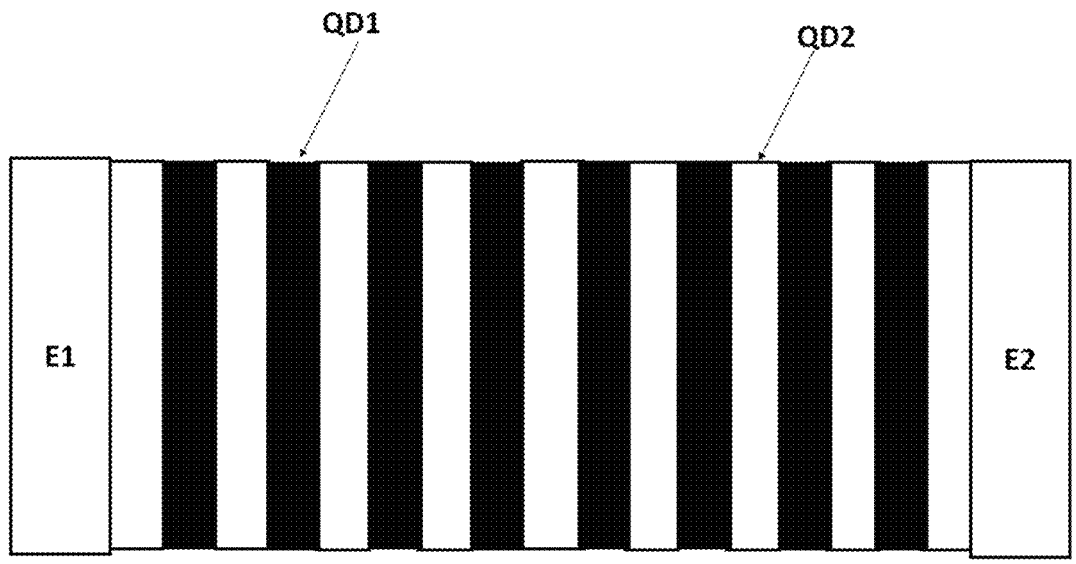

FIG. 17 schematically shows another embodiment of the optoelectronic device of the second aspect of the present invention, in which the n-type doped metal chalcogenide quantum dot solid-state film has been obtained according to the method of the first aspect for an embodiment for which the film is a layered structure alternating layers of heavily n-doped metal chalcogenide low bandgap quantum dots and not n-doped (or slightly n-doped) metal chalcogenide high bandgap quantum dots.

Figure 18:
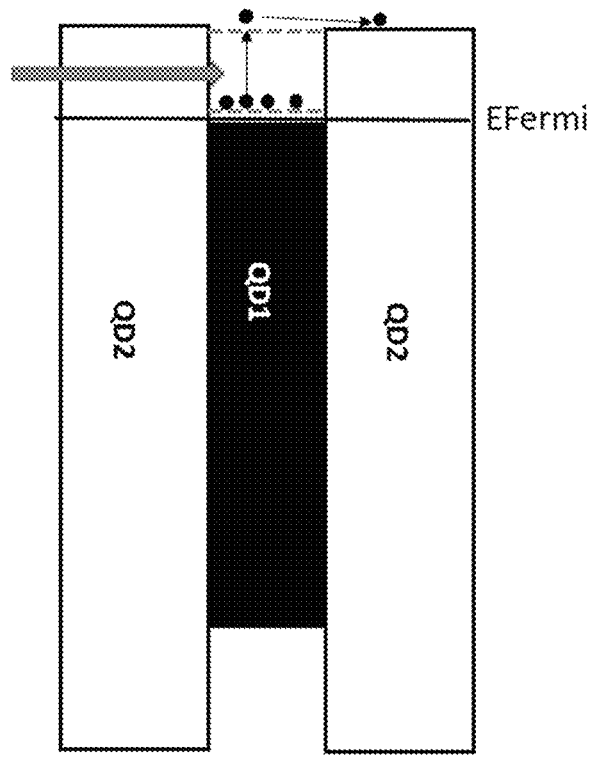

FIG. 18 schematically illustrates the mechanism for intraband carrier transition through the small bandgap heavily n-doped quantum dots, and the carrier transfer therefrom to the not n-doped or slightly n-doped quantum dots, upon low infrared excitation, for a film obtained according to the method of the first aspect of the present invention.

Figure 19:
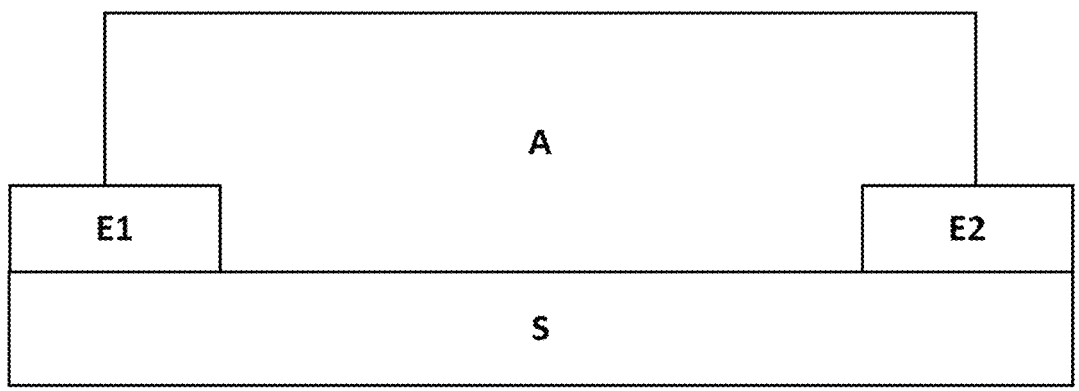

FIG. 19 schematically shows an embodiment of the optoelectronic device of the second aspect of the present invention, for which the device implements a planar photodetector.

Figure 20:
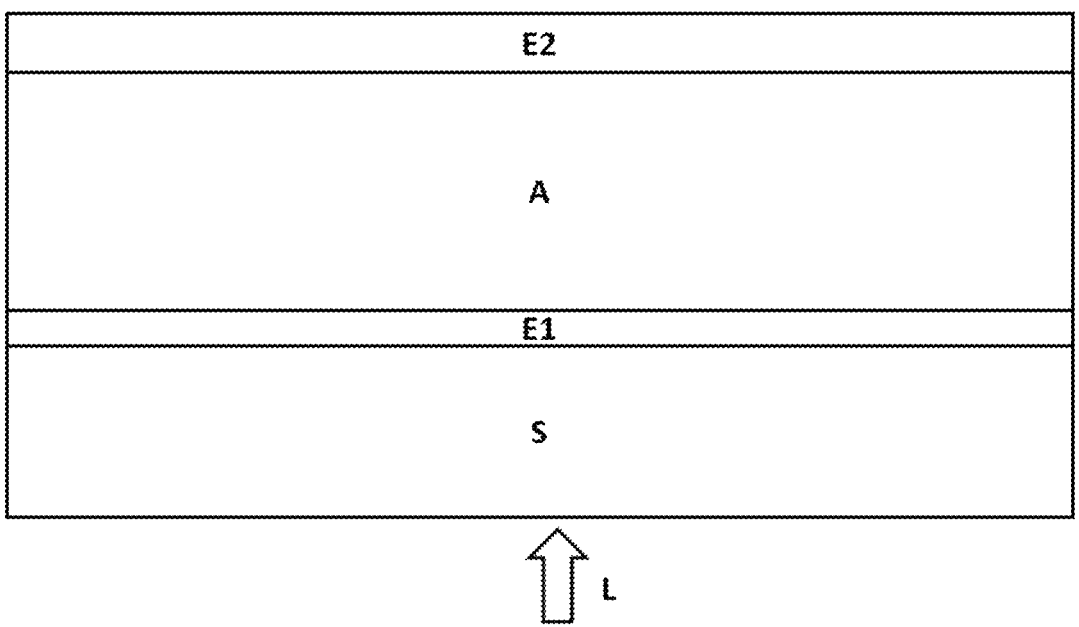

FIG. 20 schematically shows another embodiment of the optoelectronic device of the second aspect of the present invention, for which the device implements a vertical photodetector made to detect light incident from the bottom, i.e. impinging on and passing through the substrate.

Figure 21:
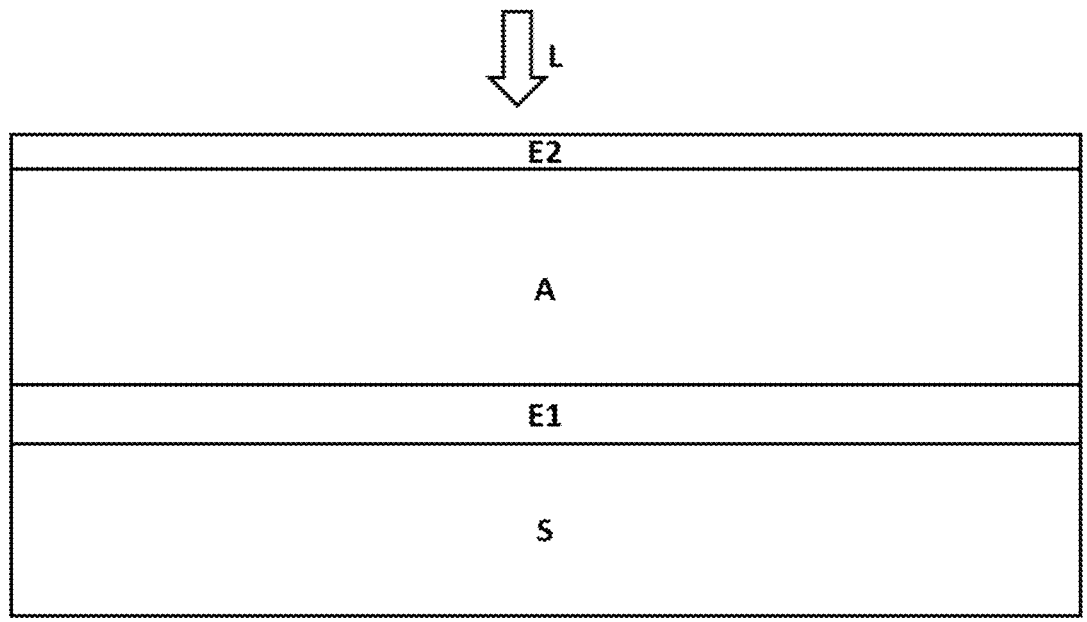

FIG. 21 schematically shows another embodiment of the optoelectronic device of the second aspect of the present invention, for which the device implements a vertical photodetector made to detect light incident from the top, i.e. impinging and passing through the upper electrode.

Figure 22A:
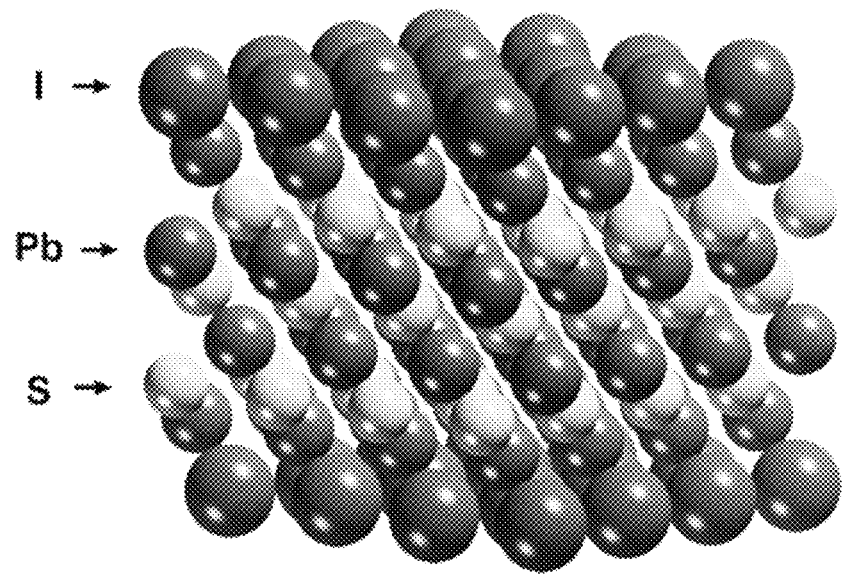
Figure 22B:
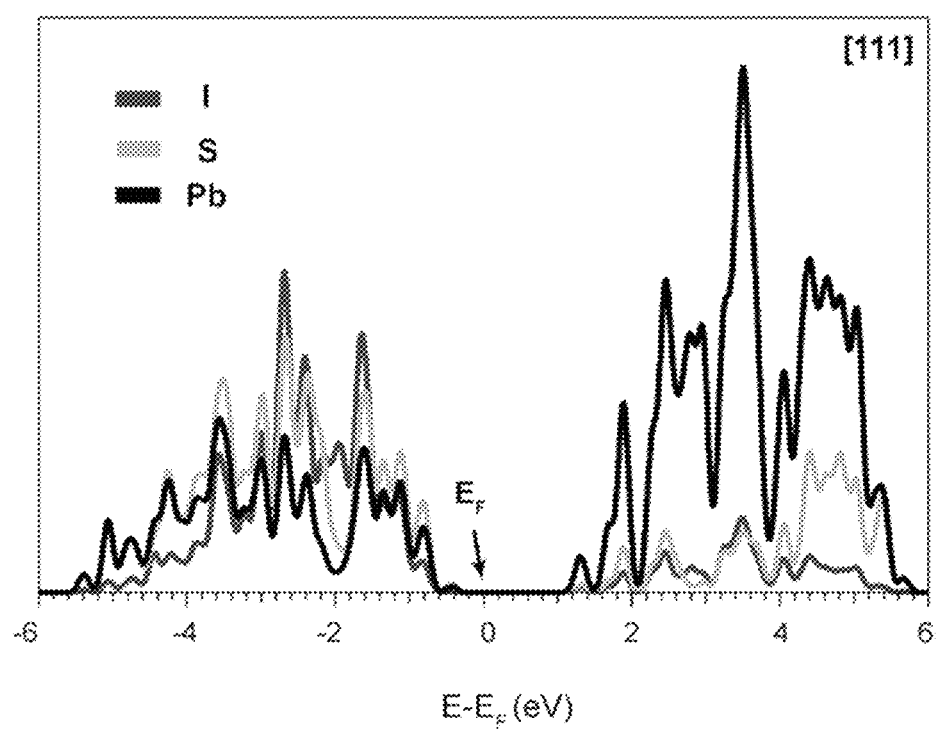

FIGS. 22A and 22B do not correspond to the present invention but to a process which consists in providing a high surface coverage by binding Iodide atoms to Pb atoms on the surface. FIG. 22A Schematic representation of (111) surface with Iodine passivation; FIG. 22B Calculated density of states of the (111) surface. This Figure and its corresponding description below is provided to demonstrate that surface coverage is an irrelevant issue for the present invention.

DESCRIPTION OF THE PREFERRED EMBODIMENTS

In the present section, by means of several experiments detailed below, the present inventors demonstrates the feasibility and good results offered by the present invention, specifically for embodiments for which the metal chalcogenide quantum dot solid-state films are PbS quantum dot solid-state films, and sulphur atoms are partially substituted by iodine atoms.

Specifically, it is here demonstrated that the present invention provides a robust doping strategy for PbS quantum dot solid-state films that allows harvesting of mid- and long-wave infrared radiation, well beyond the reach of PbS even in its bulk form. Heavy n-type doping is achieved by iodine substitution of sulphur and effective isolation from ambient oxygen, which leads to simultaneous interband bleach and rise of intraband absorption. The present inventors show doping to be stable under ambient conditions allowing, for the first time, to realize intraband PbS CQD photodetectors for energies below the bulk bandgap, in the 5-12 μm range.

Here, the present inventors demonstrate for the first time intraband absorption and photodetection for photon energies well below the bulk bandgap in PbS CQD solids.

Here, the present inventors show that with an efficient substitution of sulphur by iodine, combined with isolation of the dots from oxygen, the present inventors can control the effective population of the conduction band (CB) and permit a steady-state probing of intraband transitions in PbS CQDs. The proposed doping strategy allows the removal of the oxygen that incorporated in the film during its formation, even when merely physisorbed [17]. The present inventors argued that submission of the CQD film to, for example, atomic layer deposition (ALD) of alumina ($Al_2O_3$) should be doubly beneficial for the intended purposes. Firstly, encapsulation with alumina inhibits the oxidation process in PbS CQDs by isolating the film from the atmosphere [18]. Secondly, the layer-by-layer ALD method allows infiltration of the precursors inside the film [18]. Therefore, the aluminium precursor used in the deposition process is expected to react, not only with the oxygen precursor ($H_2O$), but also with the highly reactive oxygen adsorbates present in the film, thus suppressing their p-doping effect.

Figure 1A:
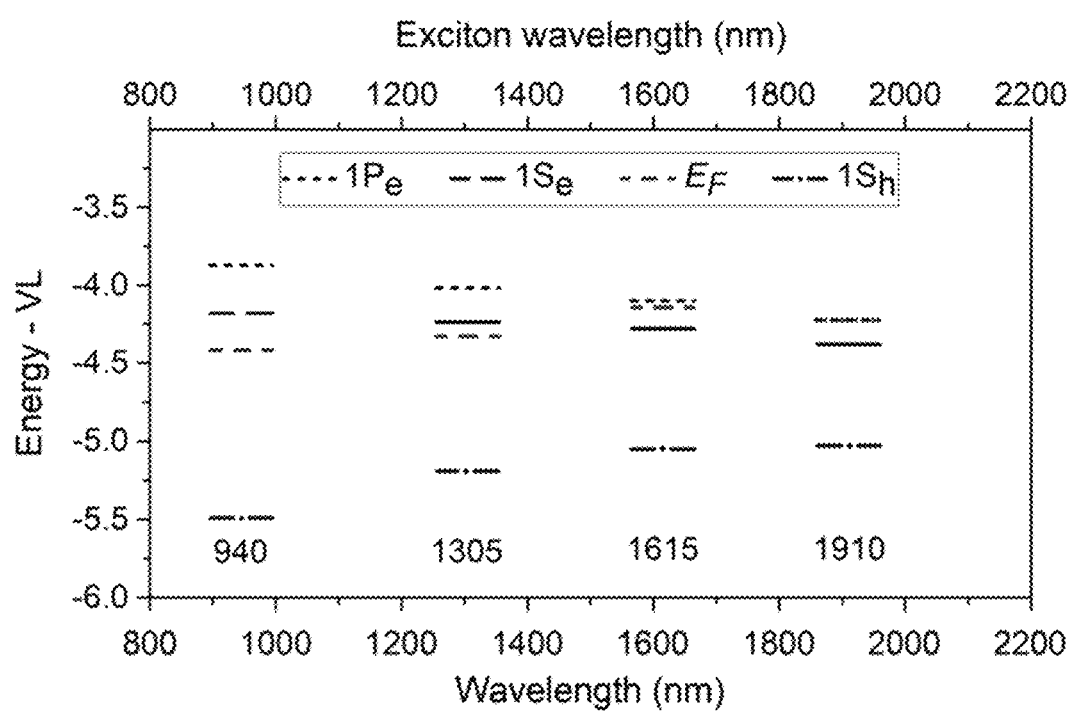
FIGS. 1A, 1B, 1C. Electrical and optical characterization of the doping density of the iodine-doped PbS CQDs, according to an embodiment of the method of the first aspect of the present invention.
Figure 1B:
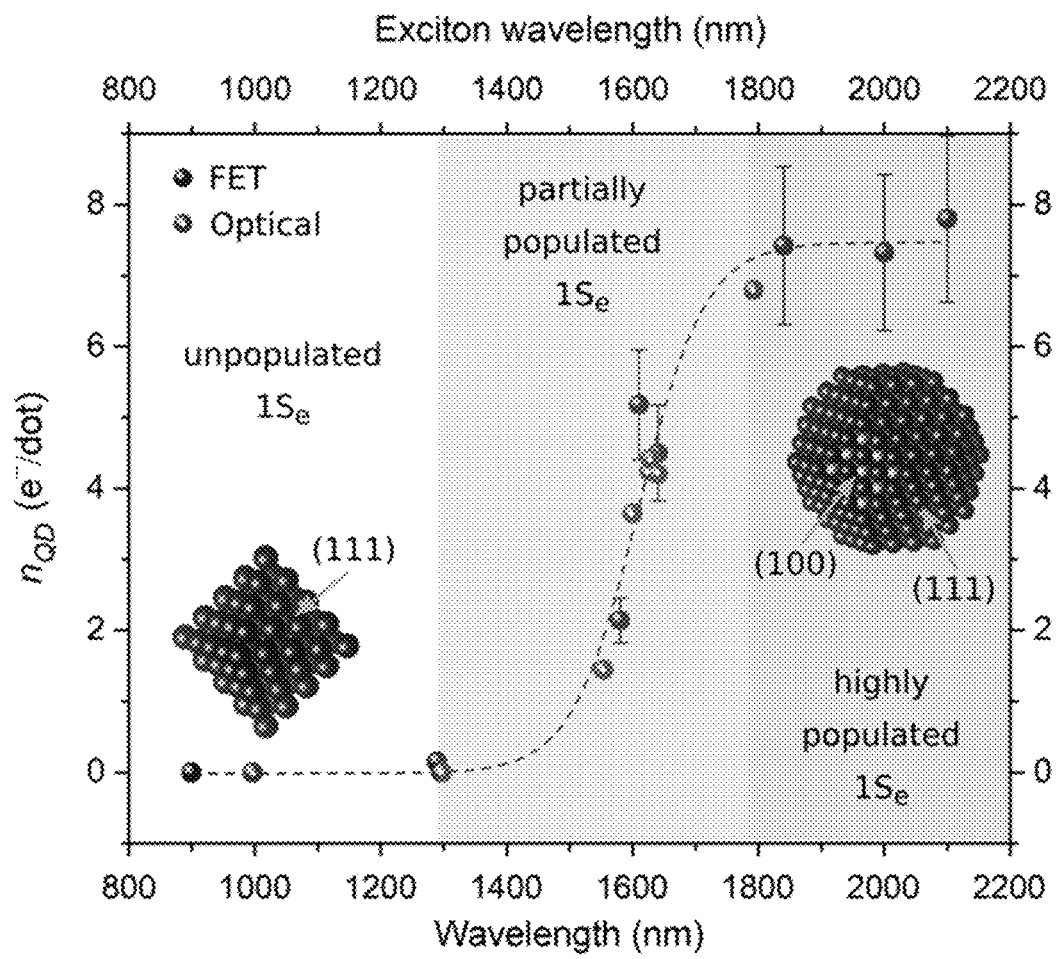
Figure 1C:
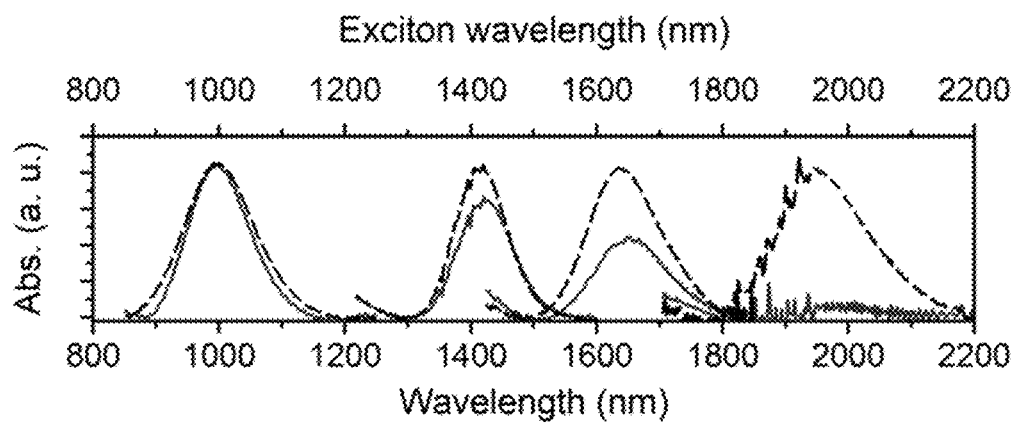

The present inventors have synthesized PbS CQDs following different embodiment of the method of the first aspect of the present invention and fabricated films (under ambient atmosphere) with an optimized procedure for exchanging the original oleate ligands by iodide (see Experimental Section). FIG. 1A shows the main results of ultraviolet photoelectron spectroscopy (UPS) of the proposed iodide-exchanged PbS dots. The UPS data (FIGS. 4A, 4B, 4C, 4D) have been analysed following the correction proposed in [19]. Four samples, with exciton wavelengths ranging from 940 nm to 1910 nm, have been measured. All samples exhibit n-type character, since the Fermi level ($E_F$) is closer to the CB ($1S_e$ state) than to the valence (VB, $1S_h$ state). Interestingly, the n-type character gets stronger as the particle size increases (exciton wavelength increases) such as, for the largest particles measured, the Fermi level sits above the $1S_e$ state, which means that the CB is populated under equilibrium. Following the same methods, the present inventors have fabricated films for absorption measurements with QDs of different sizes. The present inventors have performed absorption measurements before and after deposition of alumina. FIG. 1C shows the absorption spectra, at the exciton wavelengths, of the used samples. Before alumina deposition (black lines), all samples exhibit strong excitonic absorption. After alumina deposition, the excitonic absorption is bleached for samples with exciton wavelength larger than 1400 nm. Bleach of the first exciton transition as a result of Pauli blocking is one of the main signatures of successful population of the CB [20,21]. Note that the fact that as-prepared samples exhibit strong n-type character in the UPS measurements but not in the absorption measurements, indicates that the ultra-high vacuum conditions of UPS enable heavy n-doping. This is consistent with the presence of oxygen adsorbates in the as-prepared films under ambient conditions. Infilling with alumina, hence, is crucial to preserve the n-type doping provided by iodide ligand-exchange procedure. X-ray photoelectron spectroscopy (XPS) proves alumina infilling in the used heavily-doped samples (FIG. 5).

Both UPS and absorption measurements indicate stronger n-doping level as the size of the dot increases. This is due to the structure-dependent stoichiometry of CQDs and in particular associated to the exposed facets of different-sized QDs: Small dots have an octahedral shape with eight Pb-rich (111) facets, while, as the dot diameter increases, their morphology evolves progressively to a cuboctahedron that has, in addition, six sulphur-rich (100) facets [22] (see insets in FIG. 1B). The present inventors have performed XPS measurements of PbS CQD films, both with the original oleate ligands and with exchanged iodide ligands, without any encapsulation (see FIGS. 6A to 6L).

Quantitative analysis of the lead and sulphur data (see Table S1 below) show that the Pb/S ratio increases after ligand exchange, consistent with substitution of sulphur by iodine. Moreover, as the particle size increases (more sulphur atoms are available at the surface) the relative increase in the Pb/S ratio after ligand exchange is larger. These data support that an efficient anion substitution in the larger CQD because of the exposed (100) facets is essential in reaching the high doping regime. In contrast, small PbS CQDs do not allow this doping path in view of their (111) exposed facets, which has impeded the demonstration of heavy doping in those dots [13,15].

Table S1 below illustrates the impact of the ligand exchange process in the Pb/S ratio of PbS CQDs of different sizes (indicated by exciton wavelength). Pb/S ratio is obtained for the case of original oleate ligands (OA) and iodide ligands (EMII) by quantitative analysis of the XPS measurements shown in FIGS. 6A to 6L.

TABLE S1

|  | 820 nm OA | 820 nm EMII | 1590 nm OA | 1590 nm EMII | 1830 nm OA | 1830 nm EMII |
| --- | --- | --- | --- | --- | --- | --- |
| Pb/S ratio | 1.67 | 1.68 | 1.33 | 1.35 | 1.30 | 1.36 |
| Relative change of Pb/S ratio (%) | | 0.6 | | 1.5 | | 4.6 |

The present inventors have quantified the doping level of the used samples, $n_{QD}$, expressed in electrons per dot ($e^-$/dot) by two different means: optical (absorption) and electrical (field-effect transistor, FET) measurements (see Experimental Section). FIG. 1B shows $n_{QD}$ as a function of the exciton wavelength of the QDs. All samples are found to be n-doped in the FET measurements (FIGS. 7A to 7H).

Both methods yield close values of $n_{QD}$. Small dots (up to 1300 nm exciton) have unpopulated $1S_e$. From, approximately, 1300 nm up to 1800 nm, $n_{QD}$ increases progressively with the dot size. Beyond 1800 nm, FET results show stagnation of $n_{QD}$. Note that $n_{QD}$ stagnates at around 8 e⁻/dot. Since the $1S_e$ of PbS QDs are eight-fold degenerated (including spin), [23] $n_{QD} \approx 8$ e⁻/dot imply an almost full $1S_e$, in agreement with the complete bleach of the exciton absorption shown in FIG. 1C. Table S2 below summarizes the electrical parameters obtained via FET measurements in iodine-doped PbS CQD films. The high doping level of the samples give rise to highly-conductive films, which exhibit conductivity values close to 0.2 S·cm⁻¹.

TABLE S2

| Exciton wavelength (nm) | Mobility (cm²V⁻¹s⁻¹) | Carrier density (cm⁻³) | Conductivity (mS cm⁻¹) | $n_{QD}$ (e⁻/dot) |
| --- | --- | --- | --- | --- |
| 900 | 0.002 | 4.0E15 ± 15% | 0.001 | <10⁻⁴ |
| 1290 | 0.026 | 2.2E18 ± 15% | 9.3 | 0.15 ± 15% |
| 1580 | 0.003 | 1.3E19 ± 15% | 6.8 | 2.2 ± 15% |
| 1610 | 0.033 | 3.0E19 ± 15% | 159 | 5.2 ± 15% |
| 1640 | 0.007 | 2.4E19 ± 15% | 26 | 4.5 ± 15% |
| 1840 | 0.044 | 2.2E19 ± 15% | 154 | 7.5 ± 15% |
| 2000 | 0.090 | 1.3E19 ± 15% | 190 | 7.4 ± 15% |
| 2100 | 0.003 | 1.0E19 ± 15% | 4.1 | 7.9 ± 15% |

Figure 2A:
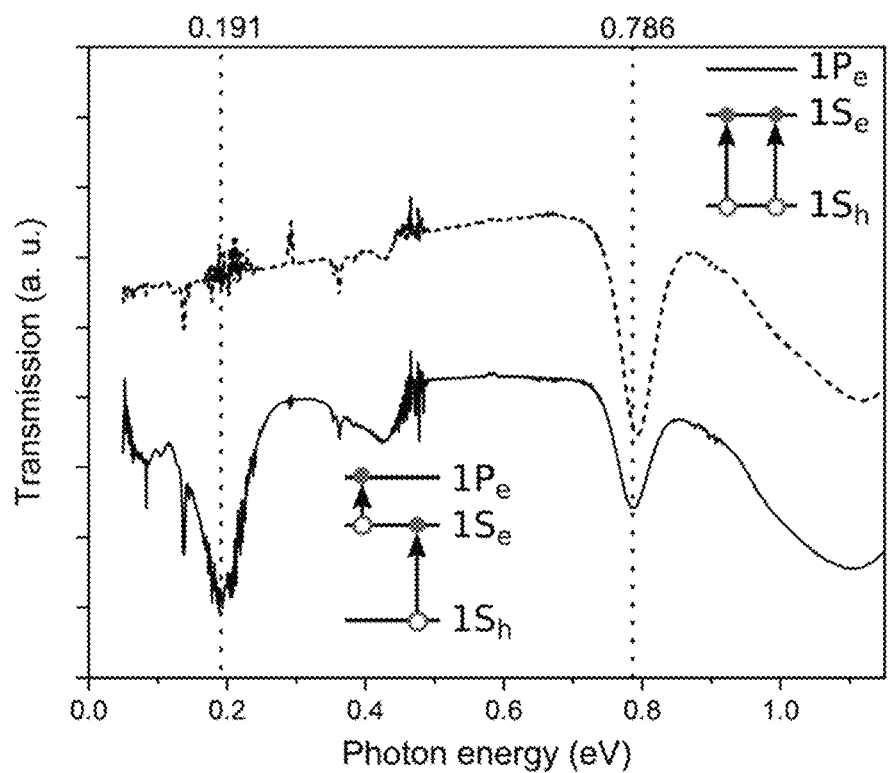
FIGS. 2A, 2B, 2C, 2D. Optical characterization of the excitonic and intraband transitions of the doped PbS QDs according to an embodiment of the method of the first aspect of the present invention.
Figure 2B:
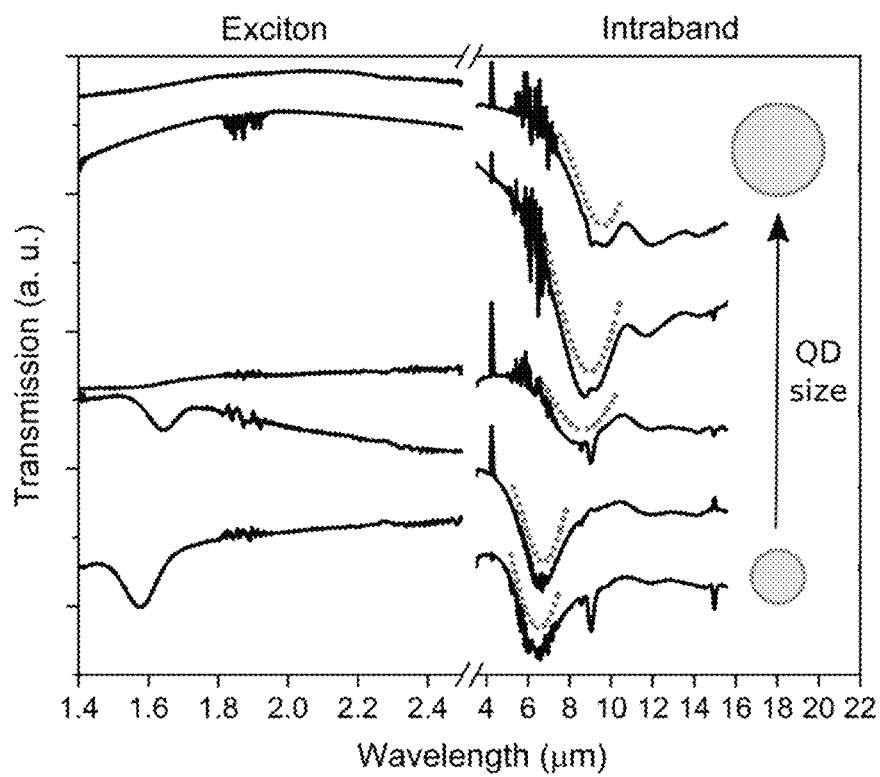

Intraband absorption is complementary to first exciton (or interband) bleach upon population of the CB [20,21]. FIG. 2A shows transmission measurements of two iodide-exchanged samples. The standard sample (without alumina, black line) shows strong absorption at the interband ($1S_h \rightarrow S_e$) transition, as illustrated in the top-right inset. After alumina deposition (and hence infilling), the exciton peak (0.786 eV) is partially bleached and a strong intraband absorption peak (0.191 eV) appears because of the partial population of $1S_e$, as illustrated in the bottom-left inset. Note that, for this sample (bandgap=1580 nm), $3 < n_{QD} < 4$ (see FIG. 1B), which explains the presence of both the interband and intraband peaks. Transmission measurements performed on PbS films exchanged with thiol ligands—instead of iodide—and encapsulated with alumina do not show exciton bleach or intraband absorption (FIG. 8), further supporting the dopant role of iodine. FIG. 2B shows transmission results for doped samples with different QD sizes, from smaller (bottom) to larger (top) dots. All samples exhibit intraband absorption, with transition peaks in the 6-9 μm range, as shown by Gaussian fittings (red dotted lines). Intraband transition redshifts as the dot gets larger, resulting from a progressive relaxation in the charge confinement. Note, as well, the progressive disappearance of the interband peak (left side of the panel) as the dot size increases. Beyond 10 μm, the alumina capping layer contributes to absorption (FIG. 9).

Figure 2C:
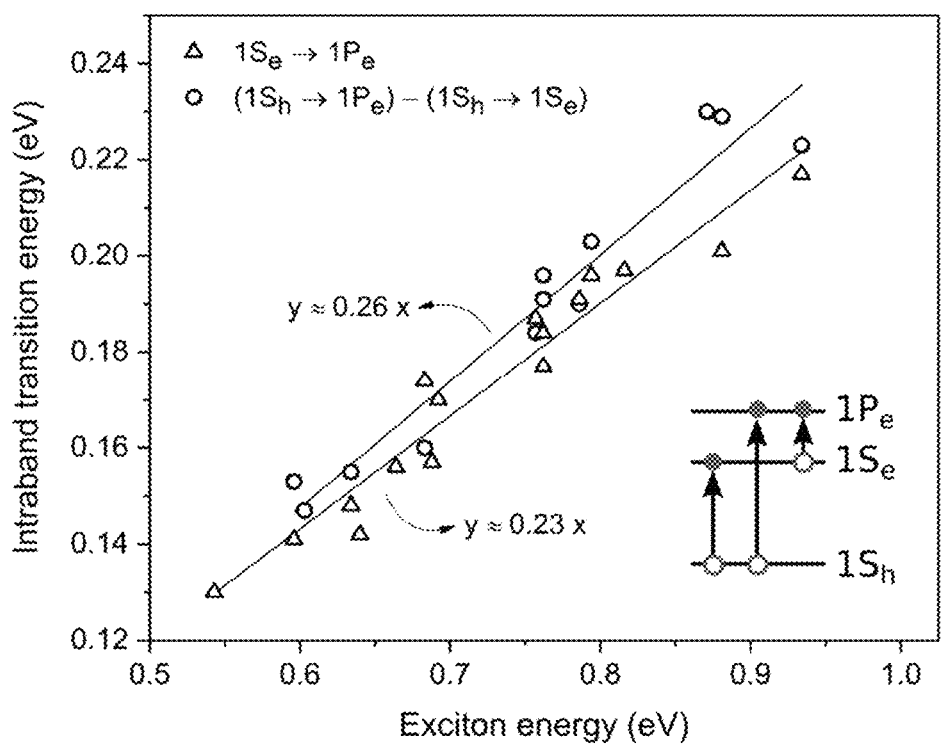
Figure 2D:
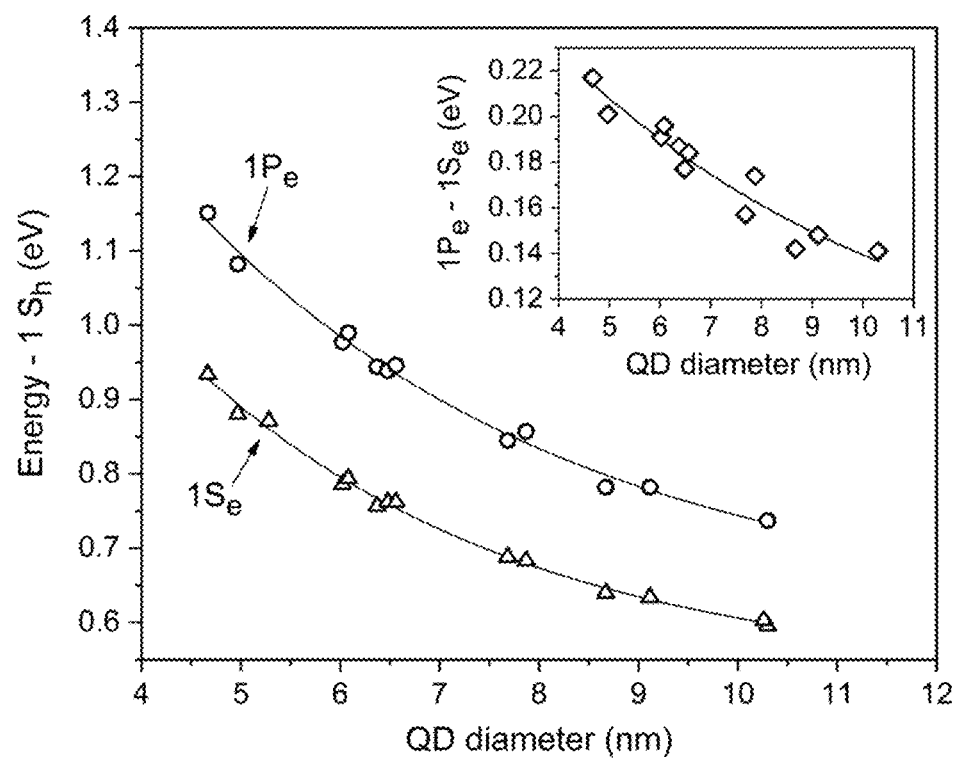
Figure 3A:
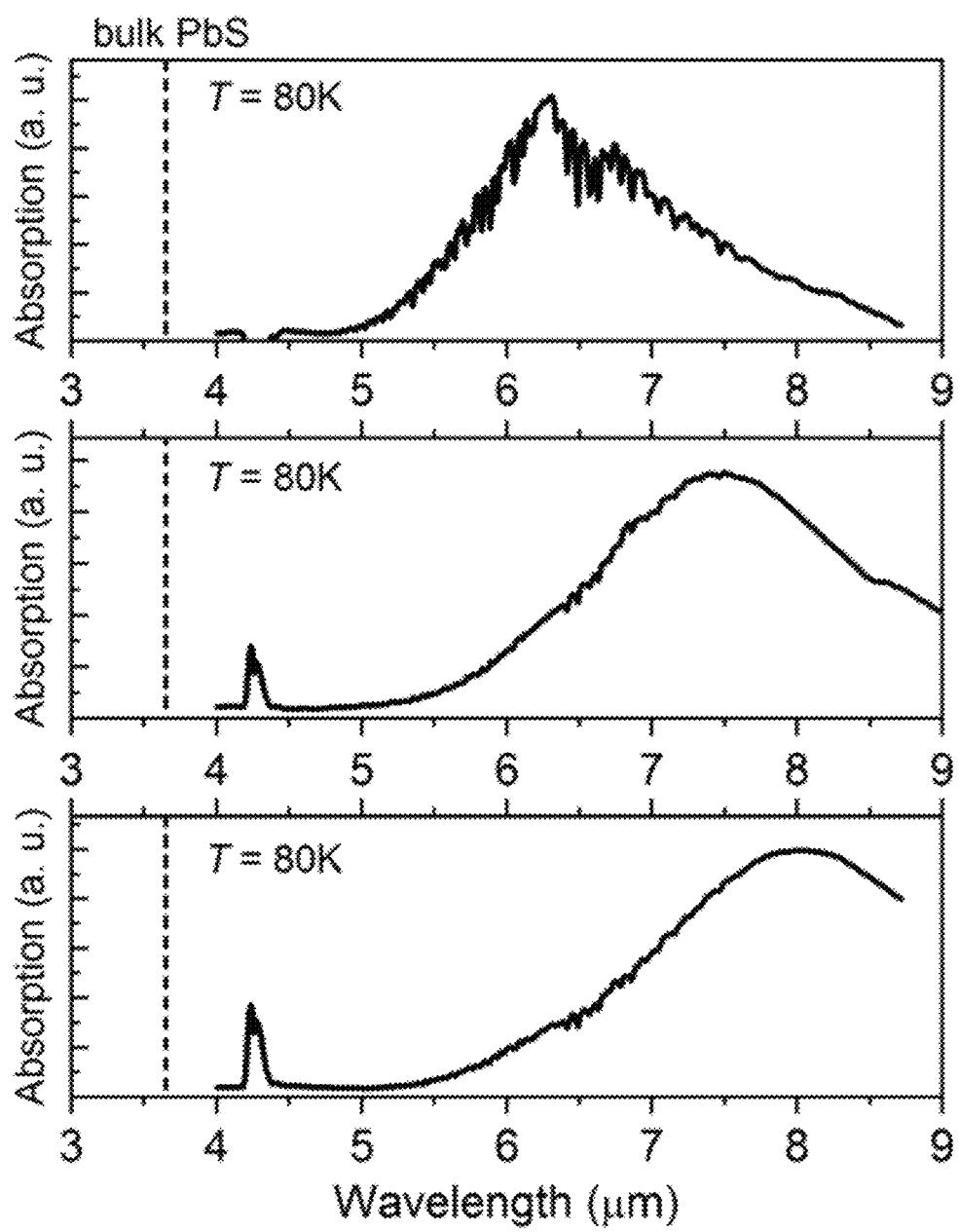
FIGS. 3A, 3B, 3C, 3D. MWIR and LWIR intraband photodetection spectra of heavily-doped PbS QDs according to an embodiment of the method of the first aspect of the present invention.
Figure 3B:
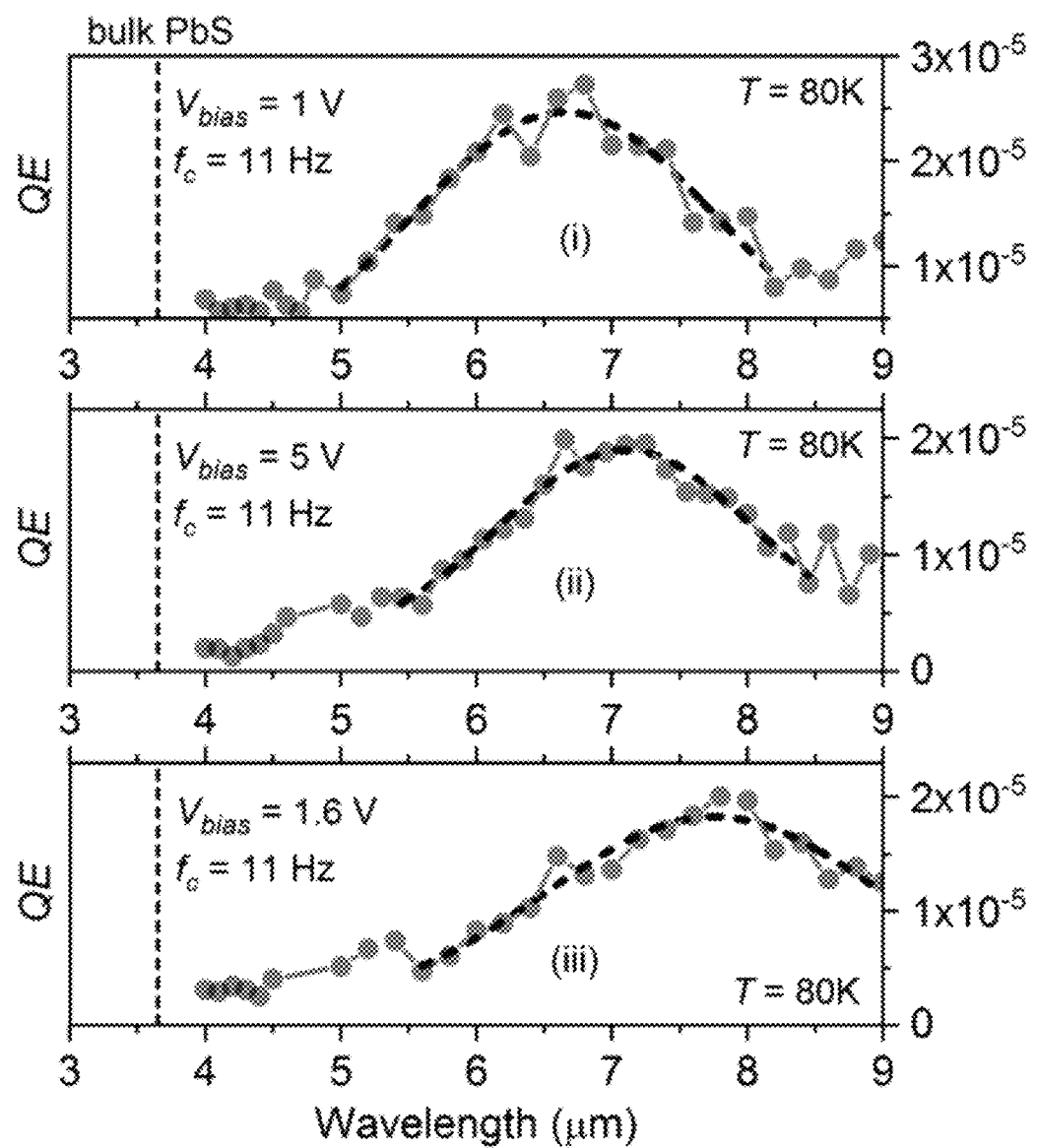

FIG. 2C shows the intraband transition energy of doped PbS CQDs versus their exciton energy. The intraband transition energy has been obtained in two different ways, as sketched in the bottom-right inset: (I) fitting direct intraband ($1S_e \rightarrow 1P_e$) absorption measurements (red circles), as previously shown in FIG. 2B; and (II) indirectly by fitting and subtracting the $1S_h \rightarrow 1P_e$ and $1S_h \rightarrow S_e$ transition energies (black circles) as shown in FIG. 10. The latter method is supported by the fact that parity selection rules are relaxed in PbS QDs, allowing the otherwise forbidden $1S_h \rightarrow 1P_e$ transition [24,25]. Both methods give a similar result for the dependence of the intraband energy with the exciton energy (red and black lines are linear fittings), thus confirming the intraband nature of the low-energy absorption of the proposed QDs. Finally, FIG. 2D plots the evolution of the measured $1S_e$ and $1P_e$ energies (relative to $1S_h$) as a function of the quantum dot diameter. The inset shows the intraband energy versus dot diameter. The sizes of the dots have been obtained from their respective measured exciton energies in solution, using the empirical model for oleate-capped PbS QDs reported in [26] and corroborated in [18] and [22]. Robust heavy doping of CQDs in solid state films opens the path to new optoelectronic devices and applications, such as photodetection, thermoelectrics, or thermo-photovoltaics. In this work, the present inventors have tested the intraband photodetection capabilities of heavily-doped PbS CQDs to extend their spectral range well beyond the material bandgap. For doing so, the present inventors have fabricated interdigitated devices for photoconductivity measurements (see Experimental Section). FIG. 3A shows the intraband absorption of QDs of different sizes, measured at 80K. FIG. 3B plots the intraband quantum efficiency, QE, spectrum of devices—fabricated using the same dots as in FIG. 3A—measured under monochromatic light at 80K. The present inventors measured intraband photodetection in the 5-9 μm range (MWIR and LWIR) using PbS CQDs. The vertical dashed lines indicate the bandgap of bulk PbS at 80K (~3.7 um).[27] The measurements performed demonstrate intraband photodetection for energies lower than the bulk bandgap, thus breaking the lower limit in CQD bandgap engineering set by the bulk value. Frequency dependent measurements (see FIG. 11) indicate that the response time of intraband detection in the devices made according to the present invention is greater than 30 ms. The present inventors have measured the specific detectivity, D*, of the proposed devices (see Experimental Section). At 80 K and 11 Hz, the present inventors have obtained peak responsivities and detectivities of: 1.5×10⁻⁴ AW⁻¹ and 4×10⁴ Jones at 6.8 μm; 1.1×10⁻⁴ AW⁻¹ and 8×10⁴ Jones at 7.3 μm; and 1.3×10⁻⁴ AW⁻¹ and 4×10⁴ Jones at 8.0 μm. Correcting by the shadowing factor of the interdigitated electrodes (~50%) and the reflectivity of the PbS layer would give rise to detectivity values on the order of 10⁵ Jones.

Figure 3C:
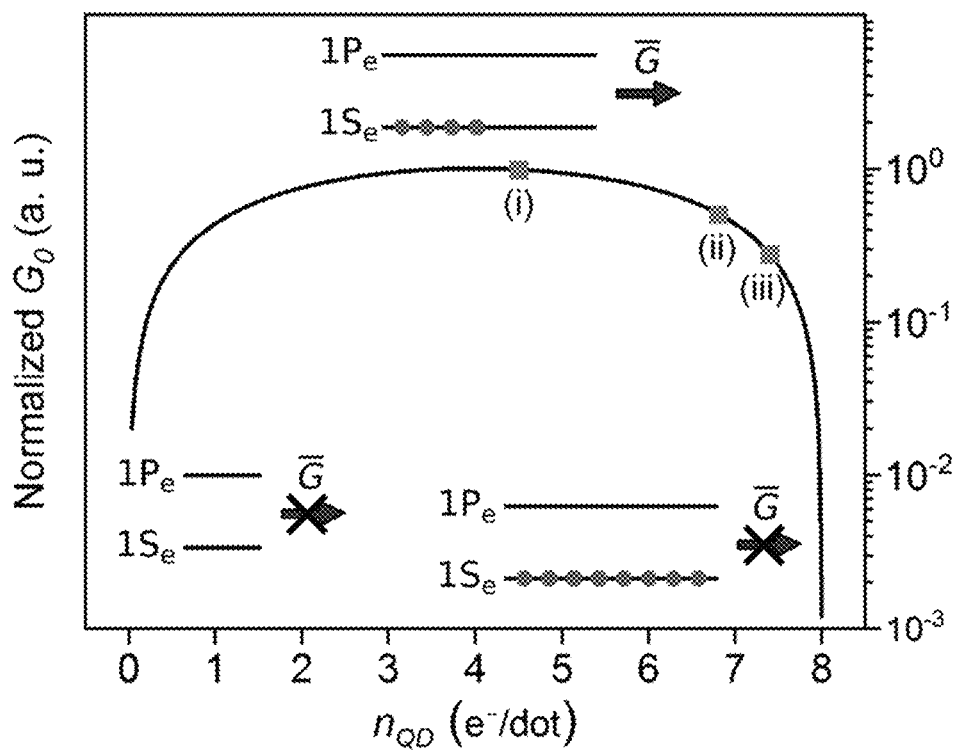
Figure 3D:
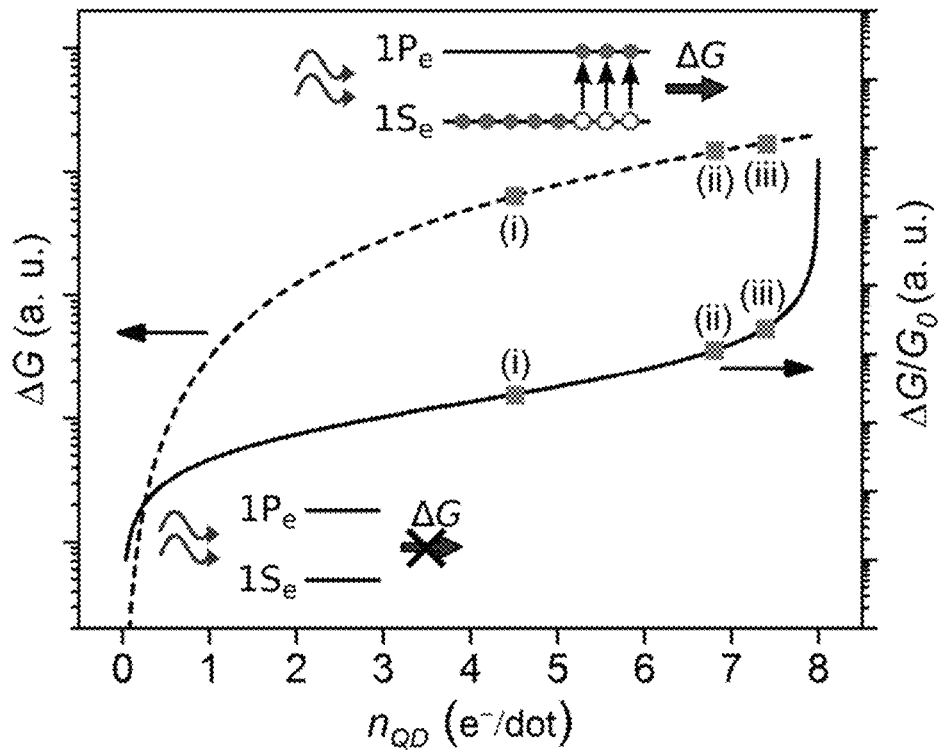
Figure 4A:
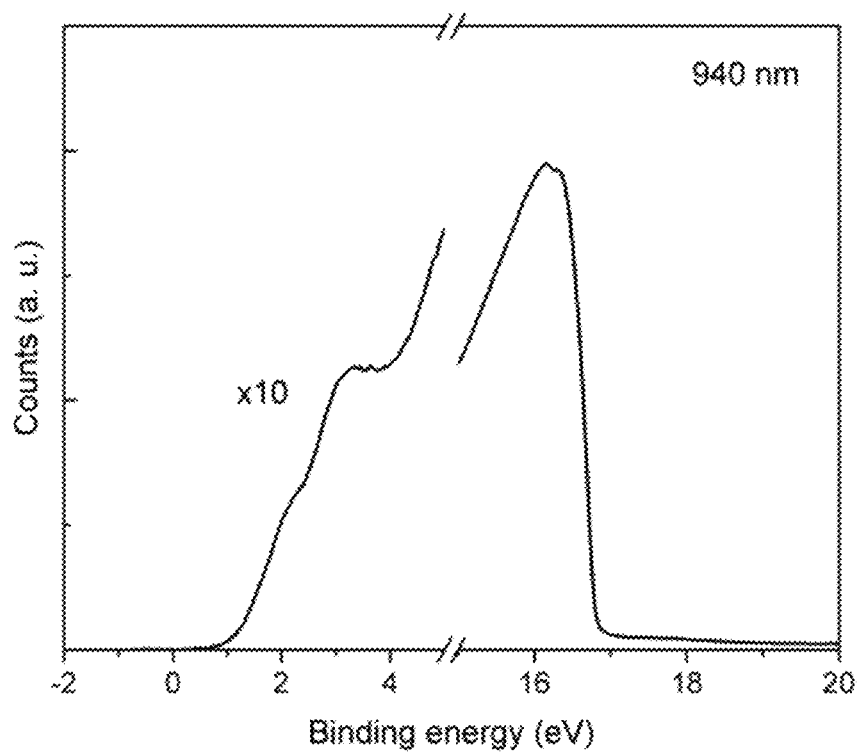
Figure 4B:
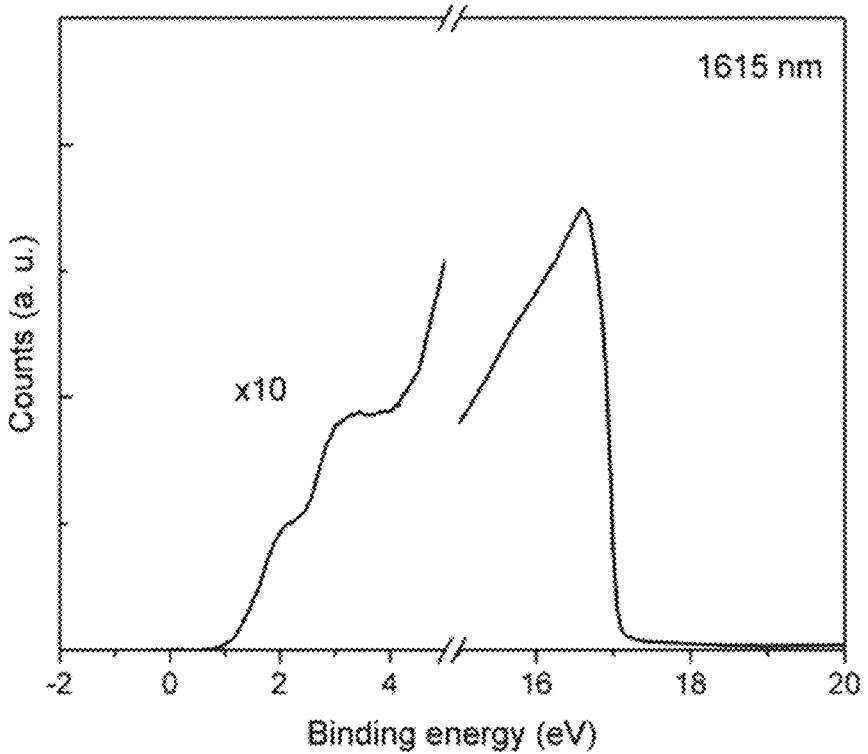
Figure 4C:
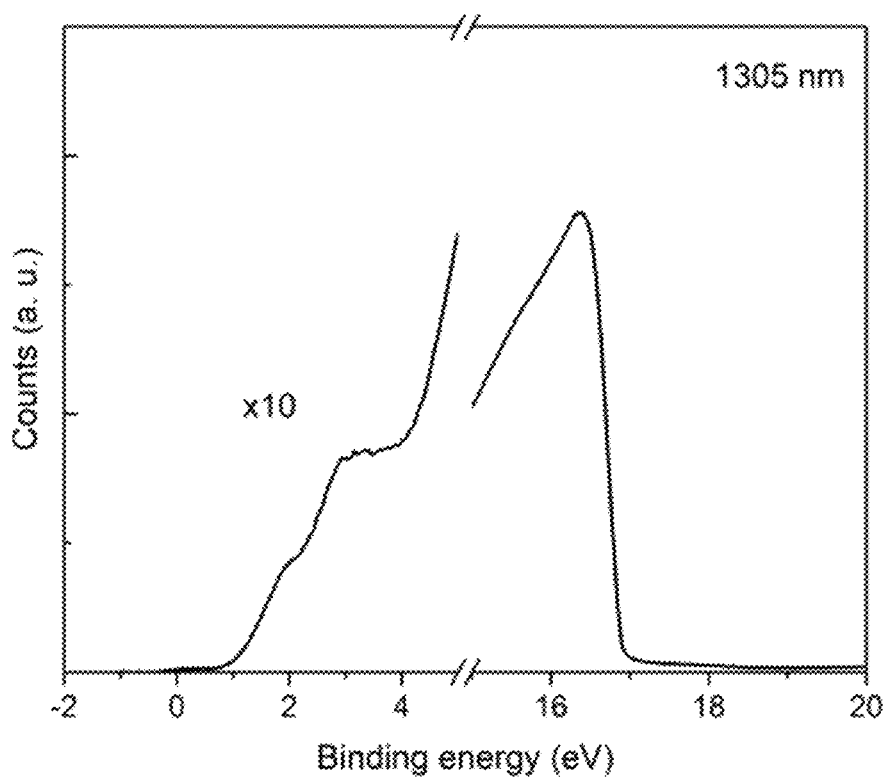
Figure 4D:
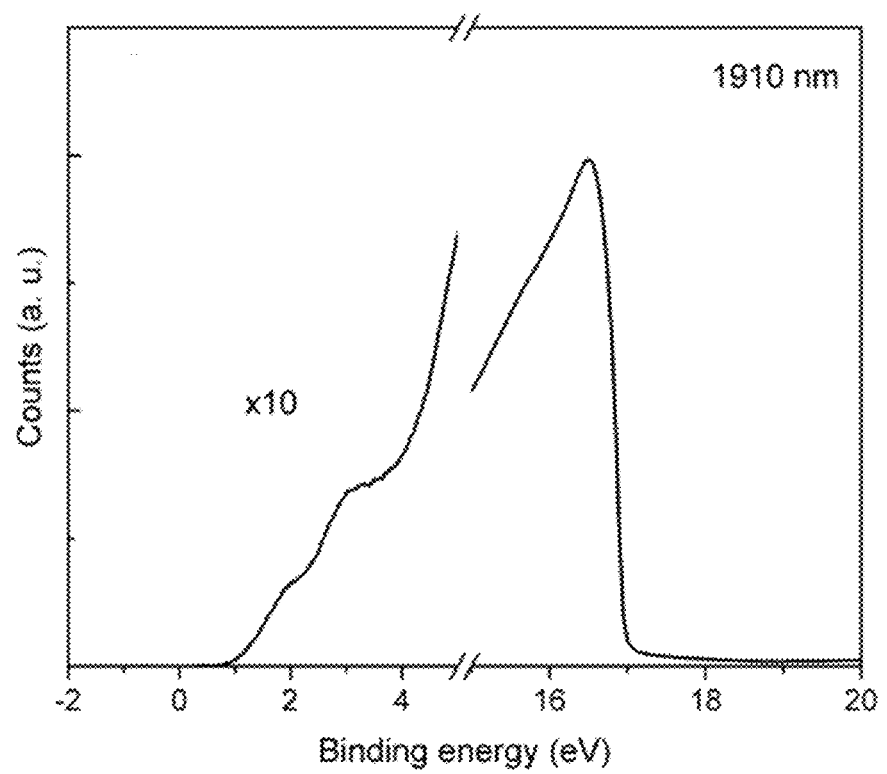

To shed insights on the performance potential of intraband PbS QD photodetectors, the present inventors have developed a quantum transport model for the proposed doped PbS quantum dot (see Supplementary Information). The method offers qualitative information of the evolution, as a function of $n_{QD}$, of the conductance of the proposed films, $G_0$, and the increase in conductance due to intraband light absorption, ΔG. The present inventors use the ratio $\Delta G/G_0$ ($n_{QD}$) as figure of merit in the present analysis, since D* is proportional to ΔG and inversely proportional to the noise spectral density, which, in turn, is proportional to $G_0$. Therefore, higher values of $\Delta G/G_0$ imply higher sensitivity. FIG. 3C shows the modelled $G_0$. It is maximum at $n_{QD}$=4 e⁻/dot (half-filled $1S_e$ state), and decreases symmetrically for lower and higher values of $n_{QD}$. The dependence is such that $G_0$ decreases very slowly until $n_{QD}$ approaches values close to 0 or 8 e⁻/dot, when it experiences a very rapid decrease. This implies that $n_{QD}$ should ideally be 0 or 8 e⁻/dot in order to minimize dark current and noise. The insets of FIG. 3C illustrate the case of $n_{Qo}$=4 e⁻/dot (max $G_0$), and $n_{QD}$=0 and $n_{QD}$=8 e⁻/dot (min $G_0$). Intraband absorption, however, is only possible if the $1S_e$ state is populated, what makes both ΔG (FIG. 3D, dashed line) and $\Delta G/G_0$ (FIG. 3D, solid line) maximum when $n_{QD} \rightarrow 8$ e⁻/dot. The insets of FIG. 3D illustrate the case of $n_{QD}$=0 e⁻/dot (min ΔG) and $n_{QD}$=8 e⁻/dot (max ΔG). The approximate values of the modelled $G_0$ and $\Delta G/G_0$ corresponding to the CQDs employed in the measured devices (FIG. 3B) are indicated by coloured squares. The obtained results show that detectivity can be further drastically increased by approaching closer to the 8 $e^-$/dot occupancy limit, pointing to further experimental research needed towards this.

In summary, the present inventors have developed a robust doping strategy for PbS CQDs which is stable under ambient conditions and has thereby allowed the present inventors to demonstrate, for the first time, intraband absorption and photoresponse from a CQD material in the Mid- and Long-wave infrared range. The size-tuneable spectral linewidth of intersubband transitions employed here taken together with the facile integration of colloidal quantum dots of different sizes may lead to CMOS compatible low-cost multispectral imaging systems in the infrared. The present invention further expands the solution-processed material availability towards the MWIR and LWIR for sensing and thermophotovoltaic energy harvesting applications.

Experimental Section:
QD Synthesis and Ligand Exchange Procedure:

The PbS QDs were synthesized by a previously reported single injection or multi-injection method with modifications [28-30]. The injection temperature and concentration of $(TMS)_2S$ in ODE were adjusted according to the final desired size of QDs. The QDs were washed with acetone/ethanol and were finally dispersed in toluene at a concentration of 30 mg/ml for device fabrication.

PbS CQD films were deposited using a layer-by-layer spin-coating process under an ambient atmosphere. For each layer, the CQD solution was deposited on either the substrate (Si, Si/SiO$_2$ or CaF$_2$) at 2,500 r.p.m. Solid-state ligand exchange was performed by flooding the surface with (I) 1-ethyl-3-methylimidazolium iodide in methanol (EMII, 7 mg/ml) or (II) 1,2-Ethanedithiol (EDT) in acetonitrile (ACN) (0.01% v/v) 30 s before spin-coating dry at 2,500 r.p.m. Two washes with (I) methanol or (II) acetonitrile were used to remove unbound ligands.

Atomic Layer Deposition:

Al$_2$O$_3$ deposition was performed in a GEMStar XT Thermal ALD system. High-purity trimethylaluminium (TMA), purchased from STREM Chemicals Inc., was used as Al precursor. Pure H$_2$O was used as O precursor. The deposition was carried out at 80° C. Before the process, the reaction chamber was pumped down and subsequently filled with pure nitrogen up to a pressure of approximately 0.56 mbar. The TMA and H$_2$O manifolds were maintained at 150° C. during gas supply. Each layer of Al$_2$O$_3$ was formed by applying a 15-ms pulse of H$_2$O at a partial pressure of 0.02 mbar, followed by a 50-ms pulse of TMA, at a partial pressure of 0.18 mbar. The waiting time between pulses was 15 s and 20 s, respectively.

Sample and Device Fabrication:

For transmission measurements, films consisting of 3 to 8 layers of QDs exchanged with either EMII or EDT were spin-coated on lowly-doped silicon substrates. After film formation, 3 to 5 nm of Al$_2$O$_3$ were deposited by ALD on some of the samples.

For photoconductance measurements, interdigitated gold electrodes were evaporated onto CaF$_2$ substrates patterned using standard photolithography methods. The area of the interdigitated devices is 1×1 mm$^2$. The width of the metal fingers is 10 µm. The distance between fingers is either 10 or 20 µm. Devices were completed by depositing 4 to 6 layers of EMIT-exchanged dots followed by ALD deposition of 3 to 5 nm of Al$_2$O$_3$.

For FET measurements, gold electrodes were evaporated onto p-Si/SiO$_2$ substrates patterned using standard photolithography methods. The p-type Si layer acted as the gate electrode. The length of the FET channel was in the 10-25 µm range. Devices were completed by depositing 2 layers of EMII-exchanged dots followed by ALD deposition of 3 to 5 nm of Al$_2$O$_3$.

For UPS and XPS measurements, thin films (4 layers) were spin-coated and ligand-exchanged, as previously described, onto ITO-coated glass substrates.

Transmission and Absorption Measurements:

Room-temperature transmission and absorption measurements were taken under ambient atmosphere, using a Cary 5000 UV-Vis-NIR spectrometer and a Cary 600 FTIR. Temperature variable measurements were taken under vacuum, using a Cary 610 FTIR microscope coupled to a temperature-controllable Linkam HFS350EV-PB4 stage equipped with ZnSe windows.

UPS/XPS Measurements and Analysis:

XPS and UPS measurements were performed with a Phoibos 150 analyser (SPECS GmbH, Berlin, Germany) in ultra-high vacuum conditions (base pressure $5 \times 10^{-10}$ mbar). XPS measurements were performed with a monochromatic Kalpha x-ray source (1486.74 eV) and UPS measurements were realized with monochromatic HeI UV source (21.2 eV). UPS data have been analysed following the correction proposed in [19]. All XPS peaks have been fitted with a GL(30) line shape while the Pb4f and S2p peaks are assigned according to previous work [31]. The quantification analysis has been performed taking under consideration the whole contribution of the lead and respectively the sulphur species corrected with the relative sensitivity factors (RSF).

TEM and FIB Measurements:

The TEM images were obtained with a JEOL JEM-2100 LaB6 transmission electron microscope, operating at 200 kV. Samples for TEM characterization were prepared by drop-casting diluted NC solutions onto 300-mesh carbon-coated copper grids in saturated toluene environment. The samples for iodine exchanged PbS CQD film imagining were prepared by drop-casting a 30 mg/mi solution onto the copper grid and spin-coated at 2500 rpm while a solid-state ligand exchange was performed in line with the aforementioned device fabrication.

The thickness of the CQD films has been determined by the cross sectional SEM images of the FET device using a Zeiss Augira cross-beam workstation. A layer of platinum was deposited via gas injection system (under FIB mode) while the cross-section cut was made with a gallium focus ion beam (Ga-FIB). The SEM imaging was carried out with an Inlens detector at the voltage of 5 kV and aperture size of 30 µm.

Fet Measurements:

Room-temperature FET transfers characteristics were measured, under ambient atmosphere, in a probe station inside a Faraday cage using a Keysight B1500A Semiconductor Device Analyser.

Measurements of Doping Level by Optical Measurements:

Since, the 1S$_e$ states of PbS are eight-fold degenerated (including spin), the number of electrons in the CB per dot, $n_{QD}$, can be calculated in a straightforward manner from the bleach of the first exciton transition (see FIG. 1C). If $I_1$ and $I_2$ are defined as the integrated absorption strength of the excitonic transition of the undoped and doped samples, respectively, then $n_{QD}=8(1-I_2/I_1)$. Note that by saying undoped sample, it is assumed that the doping (whether p-type or n-type) of the samples without alumina is low enough to consider full VB and empty CB.

Measurements of Doping Level by Electrical Measurements:

Mobility was calculated using the gradual channel approximation. By fitting the linear part of the transfer characteristic ($I_{DS}$-$V_{DS}$) of the FET devices (FIGS. 7A to 7H), the mobility, of the majority carriers can be extracted from Equation (1):

$$\mu = \frac{\frac{\partial I_{DS}}{\partial V_G} l}{w C V_{DS}} \quad (1)$$

where $I_{DS}$ is the drain-source current; $V_G$ is the gate voltage; l is the length of the channel; w is the width of the channel; C is the capacitance of the insulator; and $V_{DS}$ is the drain-source voltage. The present inventors used the value 3.9 for the relative permittivity silicon dioxide in order to calculate C. Since the $I_{DS}$-$V_{DS}$ characteristics of the proposed devices are ohmic (see FIG. 13), the carrier concentration, n, can be derived from Ohm's law as:

$$n = \frac{I_{DS0} l}{V_{DS0} \mu e d w} \quad (2)$$

where $I_{DS0}$ and $V_{DS0}$ are, respectively, the values of $I_{DS}$ and $V_{DS}$ at $V_G=0$ V; e is the elementary charge; and d is the thickness of the QD layer—which the present inventors have measured both by profilometry and FIB-SEM. To calculate the number of electrons per dot, $n_{QD}$, the value $\beta \approx 0.75 \pm 15\%$ is used, where $\beta$ is the volumetric packing density of the proposed nanoparticles. Note that, although 0.74 is the maximum packing density for spheres and usually 0.64 is taken used for the packing density of a random distribution of spheres, the maximum packing density of cuboctahedron-like nanoparticles (as it is the case of the proposed particles, see [22] and FIG. 12b) is higher, up to values higher than 0.9 [32]. Additionally TEM images (FIGS. 12c and 12d) of iodine-exchanged PbS films prepared following the exact same procedure as for the proposed FET devices, show that the proposed PbS CQDs distribute in a closed-packed regular manner, instead of following a random distribution. $n_{QD}$, can be calculated as:

$$n_{QD} = \frac{n \gamma_{QD}}{\beta} \quad (3)$$

where $\gamma_{QD} = 4/3 \pi r_{QD}^3$ is the volume of a given QD. $r_{QD}(E_0)$ is the QD radius, obtained from the measured QD bandgap, $E_0$, using the empirical model for oleate-capped PbS QDs reported in [26].

Photoconductance Measurements:

Devices were placed inside an open-cycle liquid-nitrogen cryostat equipped with a ZnSe window. A 0.3-m Bentham monochromator, equipped with adequate diffraction gratings and second-order filters, was used to monochromatize and modulate light, generated using a Nernst IR source. Light exiting the monochromator was directed onto the sample using gold mirrors, in order to avoid chromatic aberration effects. A Standford Research low-noise trans-impedance amplifier was used to bias the devices and amplify the measured current. Final signal detection was made using standard lock-in techniques. The chopping frequency used was 11 Hz.

In order to correct the measured photo-response and get absolute values for QE, the spectral power density of the monochromatic light was measured using a calibrated 0.5× 0.5 mm² Vigo Systems MCT detector. The detector was placed at the same spot where the devices stood during the photocurrent measurements. The detectivity D* is calculated as:

$$D^* \frac{\sqrt{A} \, SR}{S_n},$$

where A is the devices area in cm², SR is the peak spectral response in AW$^{-1}$, and $S_n$ is the noise spectral density $$SR = QE \frac{\lambda e}{hc},$$

where $\lambda$ is the photon wavelength, e is the elementary charge, h is Planck' constant, and c is the speed of light in vacuum. $S_n$ was calculated by measuring the dark current of the device (exactly the same measurements as the photocurrent ones, but turning the IR source off), and using the corresponding bandwidth of the measurement (1.89 mHz).

Frequency Response of Photocurrent Measurements:

To characterize the frequency dependence of the intraband photocurrent, devices were illuminated using a Block engineering LaserTune quantum cascade laser. The laser beam was mechanically chopped in the range 30-200 Hz. Photocurrent detection was done using a low-noise amplifier and a standard lock-in techniques, as previously described.

Quantum Transport Model:

With this model, the present inventors want to understand the impact of doping on the intraband detection capabilities of the proposed PbS quantum dots. The proposed approach will be to evaluate, as a function of the doping level of the dots, $n_{QD}$: (I) the steady-state conductance under a given applied bias prior to illumination, $G_0$; and (II) the change in conductance, $\Delta G$, caused by intraband absorption in the QDs. The ratio $\Delta G/G_0$ will provide a qualitative indication of the detectivity of the proposed devices, since detectivity is proportional to $\Delta G$ and inversely proportional to the noise, which, in turn, increases with $G_0$. The model analyses coherent transport between two adjacent dots, and assumes that the conductance of a matrix of quantum dots will be proportional to the conductance between dots. The present inventors note that conductance between the quantum dots and the metallic contacts is left out of the analysis, since the present inventors want to focus solely on the intrinsic material properties.

At 0K, conductance through the different possible channels between nanostructures is described by the Landauer formula [33,34]:

$$G = \frac{2e^2}{h} \mathfrak{T} \quad (4)$$

where $$\frac{2e^2}{h}$$

is the conductance quantum, e is the elementary charge, h is Planck's constant, and $\tilde{\mathfrak{F}}$ is the product of the number of propagating modes and the electron transmission probability per mode at the Fermi energy. At finite temperatures, transport takes place through multiple energy channels (in the energy range comprising a few $k_B T$ above and below the Fermi energy, $E_F$), made available by the thermal redistribution of electrons. Equation (5) is the linear response formula of conductivity at finite temperatures [34]:

$$G = \frac{2e^2}{h} \int \tilde{\mathfrak{F}}(E)\left(-\frac{\partial f}{\partial E}\right) dE \quad (5)$$

where $$f(E) = \frac{1}{e^{\left(E - \frac{E_F}{k_B T}\right)} + 1} \quad (6)$$

is the Fermi function and determines the electron occupancy factor (from 0 to 1) at levels of energy E. Equation (5) will be the starting point of the proposed model and will allow the present inventors to evaluate how conductance is affected by small variations of f. Note that in the experiments carried out by the present inventors the light power density employed was low (in the $10^{-5}$-$10^{-4}$ W/cm$^2$ range) so that it would modify only slightly, in relative terms, the carrier populations of the proposed highly doped (~$10^{19}$ cm$^{-3}$) samples.

Considering the present case of study, FIG. 14 depicts the lowest energy levels of the CB of the proposed QDs ($1S_e$ is the eight-fold degenerated ground state, with energy $E_S$; and $1P_e$ is the first excited state, with energy $E_P$). In general, it can be said that conduction will take place either through $1S_e$ channels ($G_S$) or $1P_e$ channels ($G_P$). Since conductance through parallel channels add up, $G = G_S + G_P$. Prior to illumination, $1S_e$ is partially populated through doping. $1P_e$ is not populated, since the intraband energy (150-250 meV) is much greater than $k_B T$ (~7 meV at 80K). This is represented in FIG. 14 by placing $E_F$ closer to $1S_e$ than to $1P_e$.

For finite population of $1S_e$, one can approximate $\tilde{\mathfrak{F}}(E) = \tilde{\mathfrak{F}}_S \delta(E - E_S)$ in Equation (5), where $\tilde{\mathfrak{F}}_S$ is the product of the number of propagating modes and the electron transmission probability at $E_S$. This means that under non-illumination steady-state conditions, conductance occurs only through $1S_e$ channels and $G_0 = G_S$.

And further substituting $$-\frac{\partial f}{\partial E} = \frac{1}{k_B T} f(1-f) \quad (7)$$

in Equation (5), it is obtained that, prior to illumination:

$$G_S = K_S [f_S (1 - f_S)] \quad (8)$$

where $$K_S = \frac{2e^2}{h} \frac{1}{k_B T} \tilde{\mathfrak{F}}_S,$$

and $f_S = f(E_S)$.

When light resonant to the $1S_e \rightarrow 1P_e$ transition is shone on the QDs, a (negative) $\Delta f$ is produced in the $1S_e$ states, since some electrons are excited from $1S_e$ to $1P_e$. For simplicity, hereafter it will be assumed that electron excitation and relaxation only takes place between the $1S_e$ and $1P_e$ states. For a low excitation photon flux, F, the absorbed light is proportional to the population of $1S_e$, which, in turn, is proportional to $f_S$. Therefore, $\Delta f \approx \alpha F f_S$, where $\alpha$ is a proportionality factor related to the absorptivity of the sample and the lifetime of the electrons in the $1P_e$ states. For low enough F, $\alpha F f_S \rightarrow 0$ and $$G(f_S - \Delta f) \approx G_S - \Delta f G_S' \approx G_S - \alpha F f_S G_S' \quad (9)$$

where $$G_S' = \frac{\partial G_S}{\partial f_S} = K_S (1 - 2f_S).$$

At this point, contribution of $G_P$ to the local conductance can no longer be neglected, since, although weekly, $1P_e$ has now been populated. $G_P$ follows Equation (10) (similar to Eq. (8) for $G_S$):

$$G_P = K_P [f_P (1 - f_P)] \quad (10)$$

where $f_P = \varphi \Delta f$ is the electron occupancy factor of the $1P_e$ states, and $\Phi$ is the ratio between the degeneracy of $1S_e$ and the degeneracy of $1P_e$. For low enough F, $f_P \rightarrow 0$ and Equation (10) is in the linear regime, so one can approximate:

$$G_P \approx K_P f_P = K_P \Phi \Delta f \approx K_P \alpha' F f_S \quad (11)$$

where $$K_P = \frac{2e^2}{h} \frac{1}{k_B T} \tilde{\mathfrak{F}}_P, \tilde{\mathfrak{F}}_P$$

is the product of the number of propagating modes and the electron transmission probability at the energy $E_P$, and $\alpha' = \Phi \alpha$. Finally, the total conductance under illumination is obtained by adding Eqs. (9) and (11):

$$G = G_S + G_P = [G_S - \alpha F f_S G_S'] + [K_P \alpha' F f_S] = K_S f_S (1 - f_S) + F \alpha f_S (K_P \Phi - K_S + 2K_S f_S) = G_0 + \Delta G \quad (12)$$

where $G_0 = K_S f_S (1 - f_S)$ [Equation (8)] and $\Delta G = \alpha f_S (K_P \Phi - K_S + 2K_S f_S)$ is the variation in conductance due to illumination. The photocurrent measured in the here described experiments is proportional to $\Delta G$; hence, the detectivity, D*, of the proposed detectors is proportional to it as well. However, D* is inversely proportional to the dark current of the device and, therefore, to $G_0$. Manipulating Equation (12), one obtains:

$$D^* \propto \frac{\Delta G}{G_0} = \frac{a f_S + b}{1 - f_S} \quad (13)$$

where $a = 2\alpha F$ and $$b = F\alpha \left(\frac{K_P}{K_S} \Phi - 1\right).$$

For an eight-fold degenerated $1S_e$, the present inventors can calculate the occupancy factor of the $1S_e$ states as $f_S = 8/n_{QD}$, where $n_{QD}$ is the number of electrons that populate $1S_e$. Hence, Equation (13) can be rewritten as:

$$D^* \propto \frac{\Delta G}{G_0} = \frac{a(8/n_{QD}) + b}{1 - (8/n_{QD})} \quad (14)$$

Provided that $\Delta f \rightarrow 0$, the model holds for any value of $\alpha$ and F, and therefore, of a. Figure S12 shows the dependence of $\Delta G/G_0$ with $n_{QD}$. In order to evaluate the sensitivity of the model to $$b\left(\frac{K_P}{K_S}, \Phi\right)$$

—related to the difference in degeneracy of $1P_e$ and $1S_e$, and the different transmission probability of their respective propagating modes—, three cases have been plotted: $K_S = K_P \Phi$, $K_S = 10 K_P \Phi$, and $K_S = 0.1 K_P \Phi$. It can be seen that b has a quantitative impact on $\Delta G/G_0$. However, it does not affect the trend of increase with increasing $n_{QD}$ and, in particular, the steep growth of when $n_{QD} \rightarrow 8$. The present inventors conclude that, in all cases, full population of $1S_e$ (while preserving an empty $1P_e$) is desired to maximize detectivity.

FIG. 15 shows that $\Delta G/G_0$ is inversely proportional to $m = K_S/(K_P \Phi)$. This dependence is explained by $\Delta G$ increasing with $K_P \Phi$, since $G_P$ is proportional to this product, while $G_0$ is independent of it (all transport occurs through the $1S_e$ state under dark conditions). In all cases, high values of $\Delta G/G_0$ are obtained when $n_{QD} \rightarrow 8$.

Finally, some schematic arrangements of different embodiments of the film obtained according to the method of the first aspect of the present invention and of the optoelectronic device of the second aspect of the present invention are described below with reference to FIGS. 16-17 and 19-21, while FIG. 18 schematically illustrates the mechanism for intraband carrier transition.

Specifically, FIG. 16 shows an embodiment in which the optoelectronic device comprises, sandwiched between first E1 and second E2 electrodes, the n-type doped metal chalcogenide quantum dot solid-state film A obtained according to the method of the first aspect for an embodiment for which the film A is a blend of electrically connected QDs comprising different sizes so as to form a type-I heterojunction, in which the small bandgap quantum dots QD1 are heavily doped exhibiting intraband absorption whereas the large bandgap quantum dots QD2 are not heavily doped in order to preserve low dark current of the device. The band offset of the two populations of QDs is such that the energy difference, for example in the conduction band, is equal or smaller that the intraband energy of the small bandgap quantum dots QD1. The loading of small bandgap quantum dots QD1 in the matrix of large bandgap quantum dots QD2 may range from 1% up to 50% and preferably between 5% and 25%.

Another embodiment of the optoelectronic device of the second aspect of the present invention is schematically shows in FIG. 17, in which the n-type doped metal chalcogenide quantum dot solid-state film A is a layered structure alternating deposited layers of heavily n-doped metal chalcogenide low bandgap quantum dots QD1 and not heavily n-doped metal chalcogenide high bandgap quantum dots QD2, forming a superlattice structure arranged between first E1 and second E2 electrodes. The thickness of the layers may each range from 5 nm up to 100 nm and the number or such layers may be from 1 up to 100, but not limited to 100 necessarily.

In both cases, the mechanism is that upon low energy infrared excitation (e.g. light with wavelength from 3 um until 12 um) excites the small bandgap doped quantum dots QD1 through the first intraband transition so that an electron moves from the 1st to the 2nd excited state (FIG. 18). Then, from this 2nd excited state being at the same level of the conduction band of the large bandgap quantum dots QD2 or higher and upon the application of an electric field the electrons are injected into the matrix (in the blend case) or the next layer in the superlattice case. Given the application of an electric field this carrier will drift towards the electrode and will therefore generate a noticeable photocurrent. In the case of blend (FIG. 16) the excited carriers are transported through the matrix towards the electrode under the application of the field. In the superlattice case (FIG. 17) the carriers are enforced to encounter also one or more layers of n-doped quantum dots QD1 in which they fall but still escape and continue their transport to the electrode thanks to the applied electric field.

Possible implementations of photodetector devices are shown in FIGS. 19-21, for the optoelectronic device of the second aspect of the present invention.

Specifically, FIG. 19 shows a planar photodetector device in which the electrodes E1, E2 are deposited on the substrate S and the active material, i.e. the n-doped QDs film A, is deposited atop. The illumination comes from top directly incident on the active material A. Alternatively illumination can also come from the bottom through the substrate S; in this case the substrate S must be transparent to light of the illumination wavelengths.

FIGS. 20 and 21 illustrate a vertical photodetector device in which light L is incident either from the top (FIG. 21) or the bottom (FIG. 20). The electrode in between the active material A and the light source (E1 for FIG. 20, and E2 for FIG. 21) must have low absorption in the wavelengths of interest, such as the infrared wavelengths, and can be made, for example, of one or few layers of graphene, or a thin indium tin oxide or aluminium doped Zinc oxide thin film.

The other electrode (E2 for FIG. 20, and E1 for FIG. 21) must be a back reflector electrode that can be made of a metal that has preferably high reflectance in the wavelengths of interest, such as the infrared wavelengths, and can be for example made of gold, palladium, platinum, silver, etc.

The here provided detailed description demonstrates that surface coverage is an irrelevant issue for the present invention. Instead, the critical aspect for the present invention is the surface termination of the dots to enable substitution of chalcogen atoms, such as sulphur atoms, by halogen atoms, such as iodine atoms.

If, instead of the substitution of chalcogen atoms by halogen atoms, just a surface coverage was sought, no heavy doping could be achieved, as shown by FIGS. 22A and 22B, which do not correspond to the present invention, and shows theoretical calculations in which iodide does not substitute sulphur but instead binds to Pb atoms on the surface. It is clear from FIGS. 22A and 22B that heavy doping is not achieved at all, in contrast to the present invention.

A person skilled in the art could introduce changes and modifications in the embodiments described without departing from the scope of the invention as it is defined in the attached claims.

REFERENCES

[1] A. Rogalski, Infrared Phys. Technol. 2002, 43, 187.
[2] P. Martyniuk, A. Rogalski, Prog. Quantum Electron. 2008, 32, 89.

[3] S. Keuleyan, E. Lhuillier, V. Brajuskovic, P. Guyot-Sionnest, Nat. Photonics 2011, 5, 489.
[4] J. Kim, D. Choi, K. S. Jeong, Chem. Commun. 2018, 54, 8435.
[5] A. Stavrinadis, G. Konstantatos, ChemPhysChem 2016, 17, 632.
[6] Z. Deng, K. S. Jeong, P. Guyot-Sionnest, ACS Nano 2014, 8, 11707.
[7] N. Goubet, C. Livache, B. Martinez, X. Z. Xu, S. Ithurria, S. Royer, H. Cruguel, G. Patriarche, A. Ouerghi, M. Silly, B. Dubertret, E. Lhuillier, Nano Lett. 2018, 18, 4590.
[8] E. Lhuillier, M. Scarafagio, P. Hease, B. Nadal, H. Aubin, X. Z. Xu, N. Lequeux, G. Patriarche, S. Ithurria, B. Dubertret, Nano Lett. 2016, 16, 1282.
[9] H. Liu, D. Zhitomirsky, S. Hoogland, J. Tang, I. J. Kramer, Z. Ning, E. H. Sargent, Appl. Phys. Lett. 2012, 101, 1.
[10] D. M. Kroupa, B. K. Hughes, E. M. Miller, D. T. Moore, N. C. Anderson, B. D. Chernomordik, A. J. Nozik, M. C. Beard, J. Am. Chem. Soc. 2017, 139, 10382.
[11] A. Stavrinadis, A. K. Rath, F. P. Garcia De Arguer, S. L. Diedenhofen, C. Mágen, L. Martinez, D. So, G. Konstantatos, Nat. Commun. 2013, 4, 2981.
[12] H. Lu, G. M. Carroll, X. Chen, D. K. Amarasinghe, N. R. Neale, E. M. Miller, P. C. Sercel, F. A. Rabuffetti, A. L. Efros, M. C. Beard, J. Am. Chem. Soc. 2018, 140, 13753.
[13] Z. Ning, O. Voznyy, J. Pan, S. Hoogland, V. Adinolfi, J. Xu, M. Li, A. R. Kirmani, J. P. Sun, J. Minor, K. W. Kemp, H. Dong, L. Rollny, A. Labelle, G. Carey, B. Sutherland, I. Hill, A. Amassian, H. Liu, J. Tang, O. M. Bakr, E. H. Sargent, Nat. Mater. 2014, 13, 822.
[14] O. Voznyy, D. Zhitomirsky, P. Stadler, Z. Ning, S. Hoogland, E. H. Sargent, ACS Nano 2012, 6, 8448.
[15] D. Zhitomirsky, M. Furukawa, J. Tang, P. Stadler, S. Hoogland, O. Voznyy, H. Liu, E. H. Sargent, Adv. Mater. 2012, 24, 6181.
[16] W. K. Koh, A. Y. Koposov, J. T. Stewart, B. N. Pal, I. Robel, J. M. Pietryga, V. I. Klimov, Sci. Rep. 2013, 3, 2004.
[17] K. S. Leschkies, M. S. Kang, E. S. Aydil, D. J. Norris, J. Phys. Chem. C 2010, 114, 9988.
[18] R. Ihly, J. Tolentino, Y. Liu, M. Gibbs, M. Law, ACS Nano 2011, 5, 8175.
[19] E. M. Miller, D. M. Kroupa, J. Zhang, P. Schulz, A. R. Marshall, A. Kahn, S. Lany, J. M. Luther, M. C. Beard, C. L. Perkins, J. Van De Lagemaat, ACS Nano 2016, 10, 3302.
[20] A. M. Schimpf, K. E. Knowles, G. M. Carroll, D. R. Gamelin, Acc. Chem. Res. 2015, 48, 1929.
[21] M. Shim, P. Guyot-Sionnest, Nature 2000, 407, 981.
[22] H. Beygi, S. A. Sajjadi, A. Babakhani, J. F. Young, F. C. J. M. van Veggel, Appl. Surf. Sci. 2018, 457, 1.
[23] I. Kang, F. W. Wise, J. Opt. Soc. Am. B 1997, 14, 1632.
[24] B. Diaconescu, L. A. Padilha, P. Nagpal, B. S. Swartzentruber, V. I. Klimov, Phys. Rev. Lett. 2013, 110, 127406.
[25] G. Nootz, L. A. Padilha, P. D. Olszak, S. Webster, D. J. Hagan, E. W. Van Stryland, L. Levina, V. Sukhovatkin, L. Brzozowski, E. H. Sargent, Nano Lett. 2010, 10, 3577.
[26] I. Moreels, K. Lambert, D. Smeets, D. De Muynck, T. Nollet, J. C. Martins, F. Vanhaecke, A. Vantomme, C. Delerue, G. Allan, Z. Hens, ACS Nano 2009, 3, 3023.
[27] Z. M. Gibbs, H. Kim, H. Wang, R. L. White, F. Drymiotis, M. Kaviany, G. Jeffrey Snyder, Appl. Phys. Lett. 2013, 103, 1.
[28] J. W. Lee, D. Y. Kim, S. Baek, H. Yu, F. So, Small 2016, 12, 1328.
[29] G. Konstantatos, L. Levina, A. Fischer, E. H. Sargent, Nano Lett. 2008, 8, 1446.
[30] S. Hoogland, I. J. Kramer, O. Voznyy, A. Fischer, K. W. Chou, A. Amassian, A. H. Ip, A. J. Labelle, L. Levina, K. W. Kemp, L. R. Rollny, E. H. Sargent, G. H. Carey, S. M. Thon, D. Zhitomirsky, Z. Ning, R. Debnath, Nat. Nanotechnol. 2012, 7, 577.
[31] Y. Cao, A. Stavrinadis, T. Lasanta, D. So, G. Konstantatos, Nat. Energy 2016, 1, 16035.
[32] S. Torquato, Y. Jiao, Nature 2009, 460, 876.
[33] C. Kittel, Introduction to Solid State Physics. Eight Edition, John Wiley & Sons, 2005.
[34] S. Datta, Electronic Transport in Mesoscopic Systems, Cambridge University Press, 1997.

What is claimed is:

1. A method for obtaining an n-type doped metal chalcogenide quantum dot solid-state film, comprising:
   forming a metal chalcogenide quantum dot solid-state film, and
   carrying out an n-doping process on at least a plurality of the metal chalcogenide quantum dots of said metal chalcogenide quantum dot solid-state film so that they exhibit intraband absorption, wherein said n-doping process comprises:
   partially substituting chalcogen atoms by halogen atoms in at least said plurality of metal chalcogenide quantum dots; and
   providing a substance on at least said plurality of metal chalcogenide quantum dots, wherein said substance is made and arranged to avoid oxygen p-doping of the plurality of metal chalcogenide quantum dots.

2. The method according to claim 1, wherein said metal chalcogenide is at least one of Pb-, Cd-, and Hg-chalcogenide, wherein said chalcogen atoms are at least one of sulphur, selenium, and tellurium atoms, and wherein said halogen atoms are at least one of iodine, bromine, and chlorine atoms.

3. The method according to claim 1, comprising providing said substance to at least one of:
   coat said metal chalcogenide quantum dot solid-state film to isolate the same from ambient oxygen; and
   infiltrate within the metal chalcogenide quantum dot solid-state film to react with oxygen present therein for suppressing their p-doping effect.

4. The method according to claim 1, comprising providing said substance by atomic layer deposition (ALD).

5. The method according to claim 1, wherein said substance is at least one of alumina, titania, ZnO, and hafnia.

6. The method according to claim 1, wherein said step of forming said metal chalcogenide quantum dot film comprises forming a blend with a host matrix of first metal chalcogenide quantum dots and, embedded therein, second metal chalcogenide quantum dots having a smaller bandgap, wherein said second metal chalcogenide quantum dots are larger and have a different morphology than said first metal chalcogenide quantum dots so that the second metal chalcogenide quantum dots possess more exposed facets containing chalcogen atoms, and wherein the method comprises applying said n-doping process on the whole formed metal chalcogenide quantum dot film such that the second metal chalcogenide quantum dots are heavily n-doped while the first metal chalcogenide quantum dots are not n-doped or only slightly n-doped.

7. The method according to claim 1, wherein said step of forming said metal chalcogenide quantum dot film comprises forming a layered structure alternating layers of first and second metal chalcogenide quantum dots, wherein said second metal chalcogenide quantum dots have a smaller bandgap, and are larger and have a different morphology than said first metal chalcogenide quantum dots so that the second metal chalcogenide quantum dots possess more exposed facets containing chalcogen atoms, and wherein the method comprises applying said n-doping process:

on the whole formed metal chalcogenide quantum dot film such that the second metal chalcogenide quantum dots are heavily n-doped while the first metal chalcogenide quantum dots are not n-doped or only slightly n-doped; or only on the layer or layers of second metal chalcogenide quantum dots.

8. The method according to claim 6, comprising selecting the bandgaps and band alignment of the first and second metal chalcogenide quantum dots such that they form a type-I heterojunction and a band offset which makes that the energy difference in the conduction or in the valence bands is equal or smaller than the intraband energy of the second metal chalcogenide quantum dots.

9. The method according to claim 6, comprising forming said blend with a concentration of second metal chalcogenide quantum dots ranging from 1% up to 50% by volume, preferably between 5% and 25% by volume.

10. The method according to claim 6, comprising selecting the size and morphology of the first metal chalcogenide quantum dots such that they do not possess any chalcogen-rich exposed facet, and selecting the size and morphology of the second metal chalcogenide quantum dots such that they do possess from one to six chalcogen-rich exposed facets.

11. A product, comprising at least one n-type doped metal chalcogenide quantum dot solid-state film obtained according to a method comprising:

forming a metal chalcogenide quantum dot solid-state film, and carrying out an n-doping process on at least a plurality of the metal chalcogenide quantum dots of said metal chalcogenide quantum dot solid-state film so that they exhibit intraband absorption, wherein said n-doping process comprises:

partially substituting chalcogen atoms by halogen atoms in at least said plurality of metal chalcogenide quantum dots; and providing a substance on at least said plurality of metal chalcogenide quantum dots, wherein said substance is made and arranged to avoid oxygen p-doping of the plurality of metal chalcogenide quantum dots.

12. The product according to claim 11, which constitutes an optoelectronic device comprising:

said at least one n-type doped metal chalcogenide quantum dot solid-state film; and first and second electrically conductive electrodes in physical contact with two respective distanced regions of said at least one n-type doped metal chalcogenide quantum dot solid-state film.

13. The product according to claim 12, wherein the at least one n-type doped metal chalcogenide quantum dot solid-state film is a light absorption film made to exhibit intraband absorption to light having a wavelength included in a predetermined wavelength range that extends beyond the absorption range of the bandgap of the metal chalcogenide quantum dots when not n-doped.

14. The product according to claim 13, wherein the optoelectronic device implements a photodetector made to detect light with any wavelength included in said predetermined wavelength range, as well as within the wavelength range of interband absorption of the metal chalcogenide quantum dots of the n-type doped metal chalcogenide quantum dot solid-state film.

15. The product according to claim 14, wherein said photodetector is a planar photodetector, comprising a substrate on top of which the at least one n-type doped metal chalcogenide quantum dot solid-state film and the first and second electrically conductive electrodes are deposited, and wherein:

said substrate is not transparent to light having a wavelength included in said predetermined wavelength range, so that the photodetector detects light coming from top directly incident on the at least one n-type doped metal chalcogenide quantum dot solid-state film; or said substrate is transparent to light of any wavelength included in said predetermined wavelength range, so that the photodetector detects light coming from bottom passing through the substrate before impinging on the at least one n-type doped metal chalcogenide quantum dot solid-state film.

16. The product according to claim 14, wherein said photodetector is a vertical photodetector, comprising a substrate on top of which the first electrically conductive electrode is deposited, wherein the at least one n-type doped metal chalcogenide quantum dot solid-state film is deposited on top of the first electrically conductive electrode, and the second electrically conductive electrode is deposited on top of the at least one n-type doped metal chalcogenide quantum dot solid-state film, and wherein:

said substrate and the second electrically conductive electrode are, respectively, non-transparent and transparent to light having a wavelength included in said predetermined wavelength range, and the first electrically conductive electrode is reflective to light having a wavelength included in the predetermined wavelength range, so that the photodetector detects light coming from top passing through the second electrically conductive electrode, impinging on the at least one n-type doped metal chalcogenide quantum dot solid-state film, and being reflected by the first electrically conductive electrode; or said substrate and the first electrically conductive electrode are both transparent to light having a wavelength included in said predetermined wavelength range, and the second electrically conductive electrode is reflective to light having a wavelength included in the predetermined wavelength range, so that the photodetector detects light coming from bottom passing through the substrate, through the first electrically conductive electrode, impinging on the at least one n-type doped metal chalcogenide quantum dot solid-state film, and being reflected by the second electrically conductive electrode.

\* \* \* \* \*